(12) United States Patent
Yamawaku et al.

(10) Patent No.: US 10,283,328 B2
(45) Date of Patent: May 7, 2019

(54) PLASMA PROCESSING APPARATUS AND PLASMA PROCESSING METHOD

(71) Applicant: TOKYO ELECTRON LIMITED, Tokyo (JP)

(72) Inventors: Jun Yamawaku, Yamanashi (JP); Chishio Koshimizu, Yamanashi (JP); Tatsuo Matsudo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 733 days.

(21) Appl. No.: 14/565,612

(22) Filed: Dec. 10, 2014

(65) Prior Publication Data

US 2015/0170882 A1 Jun. 18, 2015

(30) Foreign Application Priority Data

Dec. 12, 2013 (JP) ................. 2013-257008

(51) Int. Cl.
   *C23C 16/00* (2006.01)
   *C23F 1/00* (2006.01)
   *H01L 21/306* (2006.01)
   *H01J 37/32* (2006.01)

(52) U.S. Cl.
   CPC .. *H01J 37/32577* (2013.01); *H01J 37/32091* (2013.01); *H01J 37/32137* (2013.01); *H01J 37/32165* (2013.01); *H01J 37/32541* (2013.01); *H01J 37/32568* (2013.01)

(58) Field of Classification Search
   USPC .................. 118/723 E; 156/345.43
   See application file for complete search history.

(56) References Cited

U.S. PATENT DOCUMENTS

| 5,849,372 A * | 12/1998 | Annaratone | H01J 37/32027 118/723 E |
| 5,892,198 A * | 4/1999 | Barnes | H01J 37/32082 219/121.43 |
| 8,012,306 B2 | 9/2011 | Dhindsa | |

(Continued)

FOREIGN PATENT DOCUMENTS

| JP | 9-186141 A | 7/1997 |
| JP | 2004-39844 A | 2/2004 |

(Continued)

*Primary Examiner* — Rakesh K Dhingra
(74) *Attorney, Agent, or Firm* — Rothwell, Figg, Ernst & Manbeck, P.C.

(57) ABSTRACT

Disclosed is a plasma processing apparatus including a chamber configured to perform a processing on a wafer by plasma, a VF power supply configured to change a frequency of a high frequency power to be supplied into the chamber, a susceptor configured to mount the wafer thereon, and a focus ring disposed to surround the wafer. A first route, which passes through the plasma starting from the VF power supply, passes through the susceptor, the wafer and the plasma, and a second route, which passes through the plasma starting from the VF power supply, passes through the susceptor, the focus ring and the plasma. The reflection minimum frequency of the first route is different from the reflection minimum frequency of the second route, and the frequency range changeable by the VF power supply includes the reflection minimum frequencies of the first and second routes.

22 Claims, 14 Drawing Sheets

(56) References Cited

U.S. PATENT DOCUMENTS

| | | | |
|---|---|---|---|
| 8,674,255 B1* | 3/2014 | Lenz | B23K 10/003 219/121.43 |
| 2004/0149221 A1* | 8/2004 | Koshimizu | H01J 37/32082 118/723 R |
| 2005/0269292 A1* | 12/2005 | Koshiishi | H01J 37/32027 216/67 |
| 2008/0182418 A1* | 7/2008 | Collins | C23C 16/45574 438/710 |
| 2009/0255800 A1* | 10/2009 | Koshimizu | H01J 37/32091 204/164 |
| 2010/0140221 A1* | 6/2010 | Kikuchi | H01J 37/32091 216/67 |
| 2010/0243167 A1* | 9/2010 | Hayashi | H01J 37/32568 156/345.43 |

FOREIGN PATENT DOCUMENTS

| | | |
|---|---|---|
| JP | 2004-193565 A | 7/2004 |
| JP | 2008-187179 A | 8/2008 |
| JP | 2012-142285 A | 7/2012 |
| JP | 2013-225672 A | 10/2013 |

* cited by examiner

PLASMA PROCESSING APPARATUS AND PLASMA PROCESSING METHOD

CROSS-REFERENCE TO RELATED APPLICATIONS

This application is based on and claims priority from Japanese Patent Application No. 2013-257008, filed on Dec. 12, 2013, with the Japan Patent Office, the disclosure of which is incorporated herein in its entirety by reference.

TECHNICAL FIELD

The present disclosure relates to a plasma processing apparatus and a plasma processing method which use a frequency-variable power supply.

BACKGROUND

In a capacitively-coupled plasma processing apparatus, for example, a parallel plate type plasma processing apparatus, plasma is generated between an upper electrode and a lower electrode within a processing chamber. However, the distribution of the generated plasma becomes non-uniform according to, electrical properties of a semiconductor wafer (hereinafter, simply referred to as a "wafer") disposed between the plasma and the lower electrode and components disposed within the processing chamber, or processing conditions such as the kind of a processing gas introduced into the processing chamber, and the pressure and temperature within the processing chamber. Especially, the plasma density increases in the vicinity of the center of the upper electrode.

The plasma density depends on the electric field within the processing chamber. Thus, the assignee suggested, in Japanese Laid-Open Patent Publication No. 2004-193565, a technology of dividing the upper electrode facing the space within the processing chamber into an inner electrode and an annular outer electrode surrounding the inner electrode, and setting the value of a high frequency power to be applied to the outer electrode to be larger than the value of a high frequency power to be applied to the inner electrode so as to partially control an electric field within the processing chamber. Also, in order to achieve the same object, U.S. Pat. No. 8,012,306 discloses a technology of dividing the lower electrode into an inner electrode and an annular outer electrode surrounding the inner electrode, and setting high frequency powers to be applied to the inner electrode and the outer electrode to have different values.

SUMMARY

The present disclosure provides a plasma processing apparatus comprising: a processing chamber configured to accommodate a substrate therein to perform a processing on the substrate by plasma; an electrode configured to generate the plasma within the processing chamber; and a frequency-variable power supply connected to the electrode and configured to change a frequency of a high frequency power to be supplied to the electrode. A plurality of routes of the high frequency current, which starts from the frequency-variable power supply and passes through the plasma, is present, and the plurality of routes of the high frequency current includes at least a first route and a second route, a reflection minimum frequency of the first route is different from a reflection minimum frequency of the second route, and a frequency range to be changed by the frequency-variable power supply includes the reflection minimum frequency of the first route and the reflection minimum frequency of the second route.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 12A and 12B are bottom views illustrating modified examples of a division form of an upper electrode, in which FIG. 12A illustrates a case where the upper electrode is divided into three electrodes, and FIG. 12B illustrates a case where the upper electrode is divided into a plurality of electrodes of regular hexagonal pieces.

DETAILED DESCRIPTION

Figure 1:
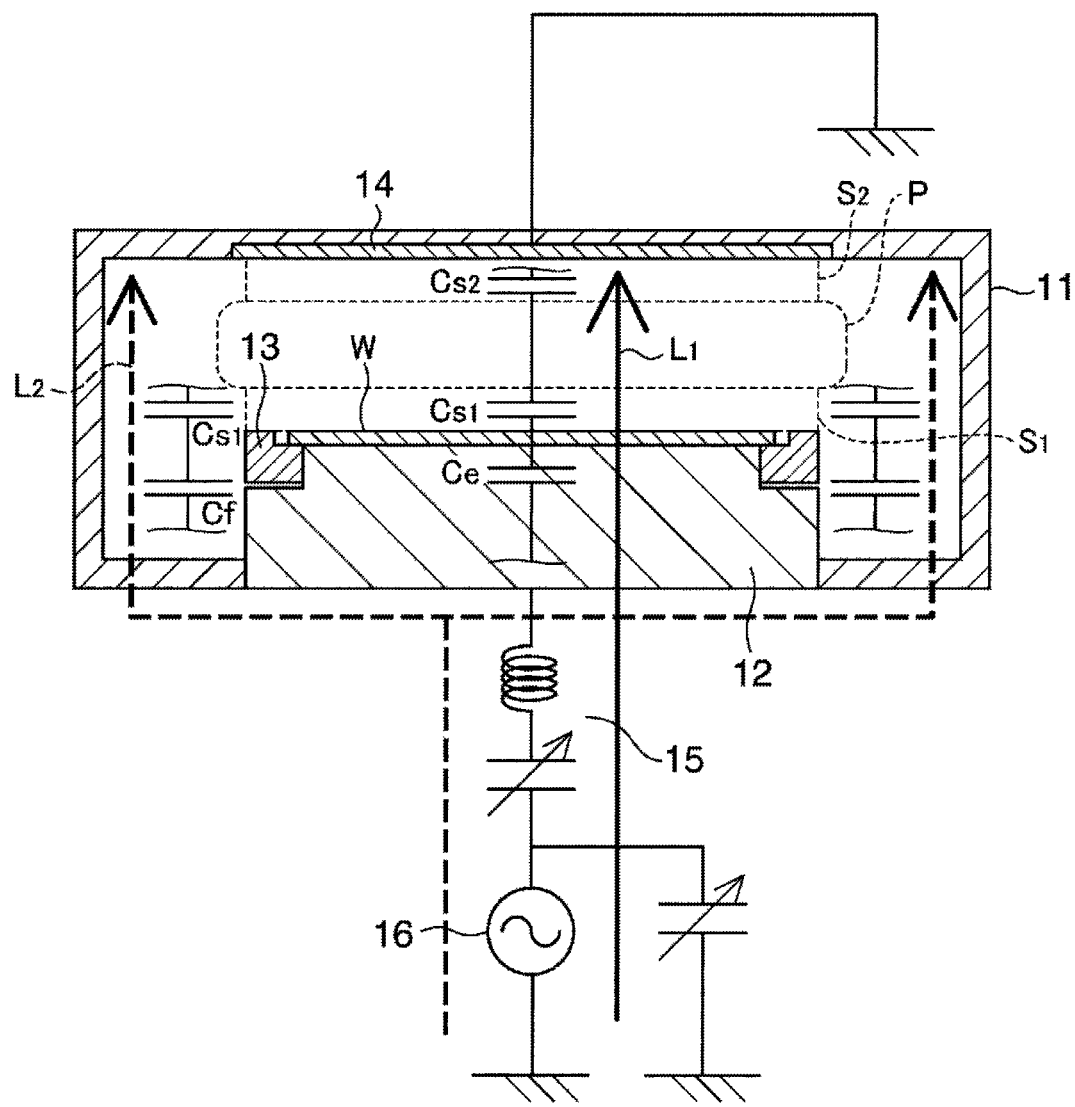
FIG. 1 is a cross-sectional view schematically illustrating a configuration of a plasma processing apparatus according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

When a high frequency power to be applied to the inner electrode, and a high frequency power to be applied to the outer electrode are set to have different values, a single high frequency power supply may apply the high frequency powers to respective electrodes. In such a case, however, a ratio of the value of the high frequency power to be applied to each electrode is determined according to the capacity of an electrical circuit from the high frequency power supply to the electrode. Thus, it is difficult to largely change only the value of the high frequency power to be applied to, for example, the outer electrode. That is, it is difficult to separately control the high frequency power to be applied to the inner electrode and the high frequency power to be applied to the outer electrode by using the single high frequency power supply. Thus, it is difficult to control plasma distribution within the processing chamber.

Meanwhile, when a high frequency power supply connected to the inner electrode and a high frequency power supply connected to the outer electrode are disposed, the high frequency power to be applied to the inner electrode and the high frequency power to be applied to the outer electrode may be separately controlled so as to control the plasma distribution within the processing chamber. However, in this case, there is a problem in that the apparatus configuration may be complicated.

An object of the present disclosure is to provide a plasma processing apparatus and a plasma processing method, which are capable of improving a degree of freedom of control of plasma distribution within a processing chamber so as to uniformly perform a plasma processing, without complicating the configuration.

In order to achieve the object, there is provided a plasma processing apparatus. The plasma processing apparatus includes: a processing chamber configured to accommodate a substrate therein to perform a processing on the substrate by plasma; an electrode configured to generate the plasma within the processing chamber; and a frequency-variable power supply connected to the electrode and configured to change a frequency of a high frequency power to be supplied to the electrode. A plurality of routes of the high frequency current, which starts from the frequency-variable power supply and passes through the plasma, is present, and the plurality of routes of the high frequency current includes at least a first route and a second route, a reflection minimum frequency of the first route is different from a reflection minimum frequency of the second route, and a frequency range to be changed by the frequency-variable power supply includes the reflection minimum frequency of the first route and the reflection minimum frequency of the second route.

In the plasma processing apparatus, a difference between the reflection minimum frequency of the first route and the reflection minimum frequency of the second route is less than 2 MHz.

The plasma processing apparatus further includes a mounting stage disposed within the processing chamber and configured to mount the substrate thereon and to serve as the electrode, and a focus ring disposed to surround the mounted substrate. The frequency-variable power supply is connected to the mounting stage, the first route passes through the mounting stage, the mounted substrate and the plasma, and the second route passes through the mounting stage, the focus ring and the plasma.

The plasma processing apparatus further includes a counter electrode which faces the mounting stage through the plasma. The counter electrode includes an inner electrode which faces the substrate, and an outer electrode disposed to face the focus ring and to surround the inner electrode, the first route also passes through the inner electrode, and the second route also passes through the outer electrode.

The plasma processing apparatus further includes a mounting stage disposed within the processing chamber and configured to mount the substrate thereon and to serve as the electrode. The processing chamber includes a side wall electrode which faces the plasma in a side wall of the processing chamber, the frequency-variable power supply is connected to the mounting stage and the side wall electrode, the first route passes through the mounting stage, the mounted substrate and the plasma, and the second route passes through the side wall electrode and the plasma.

The plasma processing apparatus further includes a mounting stage disposed within the processing chamber and configured to mount the substrate thereon and to serve as the electrode, and a capacity-variable switching box disposed outside the processing chamber to change a capacity. The frequency-variable power supply is connected to the mounting stage, the first route passes through the mounting stage, the mounted substrate, the plasma and the capacity-variable switching box, and the capacity of the capacity-variable switching box is changed according to a change of a capacity of the plasma after the plasma is ignited.

The plasma processing apparatus further includes a mounting stage disposed within the processing chamber and configured to mount the substrate thereon and to serve as the electrode, a counter electrode which faces the mounting stage through the plasma, and a circulator disposed between the counter electrode and a ground. The frequency-variable power supply is connected to the mounting stage, the first route passes through the mounting stage, the mounted substrate and the plasma, and the second route passes through the circulator, the counter electrode and the plasma.

The plasma processing apparatus further includes a mounting stage disposed within the processing chamber and configured to mount the substrate thereon, and a counter electrode which faces the mounting stage through the plasma and serves as the electrode. The counter electrode is divided into at least a first electrode and a second electrode, the frequency-variable power supply is connected to the first electrode and the second electrode, the first route passes through the first electrode and the plasma, and the second route passes through the second electrode and the plasma.

In the plasma processing apparatus, a capacitor is interposed between the frequency-variable power supply and a junction of the first route and the second route.

In the plasma processing apparatus, in the first route, the frequency-variable power supply is capacitively coupled with the first electrode, and in the second route, the frequency-variable power supply is capacitively coupled with the second electrode.

In the plasma processing apparatus, the first electrode is an inner electrode, and the second electrode is an outer electrode disposed to surround the inner electrode.

The plasma processing apparatus further includes a mounting stage disposed within the processing chamber and configured to mount the substrate thereon, and a counter electrode which faces the mounting stage through the plasma and serves as the electrode. The processing chamber includes a side wall electrode which faces the plasma in a side wall of the processing chamber, the frequency-variable power supply is connected to the counter electrode and the side wall electrode, the first route passes through the counter electrode and the plasma, and the second route passes through the side wall electrode and the plasma.

The plasma processing apparatus further includes a mounting stage disposed within the processing chamber and configured to mount the substrate thereon, a counter electrode which faces the mounting stage through the plasma and serves as the electrode, and a capacity-variable switching box disposed outside the processing chamber to change a capacity. The frequency-variable power supply is connected to the counter electrode, the first route passes through the counter electrode, the plasma, the mounted substrate, the mounting stage and the capacity-variable switching box, and the capacity of the capacity-variable switching box is changed according to a change of an impedance of the first route after the plasma is ignited.

In the plasma processing apparatus, at least one of the first route and the second route includes an impedance adjusting circuit.

The plasma processing apparatus is a parallel plate capacitive-coupled plasma processing apparatus.

In order to achieve the object, there is provided a method of performing a processing by plasma in a plasma processing apparatus. The plasma processing apparatus includes a processing chamber configured to accommodate a substrate therein to perform the processing on the substrate by the plasma, an electrode configured to generate the plasma within the processing chamber, and a frequency-variable power supply connected to the electrode and configured to change a frequency of a high frequency power to be supplied to the electrode. A plurality of routes of the high frequency current, which starts from the frequency-variable power supply and passes through the plasma, is present, the plurality of routes of the high frequency current includes at least a first route and a second route, and a reflection minimum frequency of the first route is different from a reflection minimum frequency of the second route. The frequency-variable power supply changes a frequency of the high frequency current to be generated so that the frequency includes the reflection minimum frequency of the first route and the reflection minimum frequency of the second route.

In the method, a difference between the reflection minimum frequency of the first route and the reflection minimum frequency of the second route is less than 2 MHz.

In the method, the frequency-variable power supply alternately repeats generation of the high frequency current having the reflection minimum frequency of the first route, and generation of the high frequency current having the reflection minimum frequency of the second route.

In the method, a ratio of a period where the high frequency current having the reflection minimum frequency of the first route is generated and a period where the high frequency current having the reflection minimum frequency of the second route is determined based on a ratio of a reflectivity of the high frequency current at the reflection minimum frequency of the first route, and a reflectivity of the high frequency current at the reflection minimum frequency of the second route.

In the method, the frequency-variable power supply supplies the high frequency power having a frequency between the reflection minimum frequency of the first route and the reflection minimum frequency of the second route.

According to the present disclosure, the plurality of routes of the high frequency current (that is, the first route and the second route), which starts from the frequency-variable power supply and passes through the plasma, has different reflection minimum frequencies, and the frequency range to be changed by the frequency-variable power supply includes the reflection minimum frequency of the first route and the reflection minimum frequency of the second route. Thus, the frequency-variable power supply may generate a high frequency current having the reflection minimum frequency of the first route or the reflection minimum frequency of the second route, that is, a high frequency current having a frequency at which the reflectivity of the first route is low or a frequency at which the reflectivity of the second route is low. Thus, the amount of the high frequency current flowing through the first route or the second route may be adjusted. Here, the amount of the plasma generated in the vicinity of the first route or the second route is dependent on the amount of the high frequency current flowing through the first route or the second route. Thus, the generated amount of the plasma may be locally controlled by adjusting the amount of the high frequency current flowing through the first route or the second route. As a result, the degree of freedom of control of plasma distribution within the processing chamber may be improved without complicating the configuration of the plasma processing apparatus, so that the plasma processing may be uniformly performed.

Hereinafter, exemplary embodiments of the present disclosure will be described with reference to the accompanying drawings.

First, a plasma processing apparatus according to a first exemplary embodiment of the present disclosure will be described.

FIG. 1 is a cross-sectional view schematically illustrating a configuration of the plasma processing apparatus according to the present exemplary embodiment.

In FIG. 1, a plasma processing apparatus 10 is a parallel plate type capacitively coupled plasma processing apparatus, which includes a substantially cylindrical chamber 11 (a processing chamber) inside of which is pressure-reducible, a pedestal-like susceptor 12 (a mounting stage) disposed on the bottom within the chamber 11 and configured to mount a wafer W thereon and to serve as a lower electrode, an annular focus ring 13 disposed to surround the wafer W mounted on the susceptor 12, an upper electrode 14 disposed on a ceiling portion of the chamber 11 to face the susceptor 12 and grounded, and a variable frequency power supply (hereinafter, referred to as "VF power supply") 16 connected to the susceptor 12 via an LC circuit 15 (an impedance adjustment circuit).

In the plasma processing apparatus 10, a processing gas is introduced into the decompressed chamber 11 and a high frequency power is supplied to the susceptor 12 from the VF power supply 16 so that an electric field generated by the supplied high frequency power excites the processing gas to generate plasma within the chamber 11. By the plasma, a desired plasma processing, for example, a dry etching processing or a film forming processing, is performed on the wafer W.

In the plasma processing apparatus 10, a high frequency current flows between the susceptor 12 connected to the VF power supply 16 and the upper electrode 14 having a ground potential, but plasma is generated in the route of the high frequency current. Thus, within the plasma processing apparatus 10, plasma P is generated between the susceptor 12 connected to the VF power supply 16 and the upper electrode 14, more specifically, between the susceptor 12 and the upper electrode 14. That is, the upper electrode 14 and the susceptor 12 face each other through the plasma P, in which a sheath $S_1$ is interposed between the susceptor 12 and the plasma P, and a sheath $S_2$ is interposed between the plasma P and the upper electrode 14.

When the VF power supply 16 applies a high frequency power to the susceptor 12, the high frequency power is supplied into the chamber 11, thereby generating an electric field. The VF power supply 16 may electronically change the frequency of the high frequency power to be supplied in a predetermined range, for example, in a range of ±1 MHz.

However, in the plasma processing apparatus 10, a first route $L_1$ and a second route $L_2$ exist as routes of a high frequency current which pass through the plasma P to reach the upper electrode 14, starting from the VF power supply 16.

In the present exemplary embodiment, the susceptor 12 is made of a conductive material, for example, aluminum including an insulating film such as, for example, a sprayed film of yttrium oxide ($Y_2O_3$), formed on a surface thereof. In this case, the first route $L_1$ is formed via a region including the wafer W and the upper electrode 14. Specifically, the first route $L_1$ is formed to pass through the LC circuit 15, the susceptor 12, the wafer W, the sheath $S_1$, the plasma P, the sheath $S_2$, and the upper electrode 14, starting from the VF power supply 16. The second route $L_2$ is formed via a region including the focus ring 13 and the upper electrode 14. Specifically, the second route $L_2$ is formed to pass through the LC circuit 15, the susceptor 12, the focus ring 13, the sheath $S_1$, the plasma P, the sheath $S_2$, and the upper electrode 14, starting from the VF power supply 16.

In the first route $L_1$, for example, a path capacity $C_e$ between the susceptor 12 and the wafer W, a path capacity $C_{s1}$ of the sheath $S_1$, and a path capacity $C_{s2}$ of the sheath $S_2$ exist, and in the second route $L_2$, for example, a path capacity $C_f$ of the focus ring 13, a path capacity $C_{s1}$ of the sheath $S_1$, and a path capacity $C_{s2}$ of the sheath $S_2$ exist. Thus, the first route $L_1$ and the second route $L_2$ have different specific path capacities, respectively. When the routes of the high frequency current have different path capacities, the routes have different resonant frequencies. Thus, the first route $L_1$ and the second route $L_2$ have different specific resonant frequencies.

In general, close to a resonant frequency of a route of a high frequency current, specifically, between a parallel resonant frequency and a serial resonant frequency, a reflection minimum frequency, where the reflectivity of the high frequency current becomes the lowest in the route, exists. When a high frequency current having the reflection minimum frequency flows through the route, a large amount of high frequency current may efficiently flows. That is, in the present exemplary embodiment, the VF power supply 16 may generate a high frequency current having a reflection minimum frequency $F_1$ of the first route $L_1$ (hereinafter, simply referred to as "reflection minimum frequency $F_1$") in order to cause a large amount of high frequency current to flow through the first route $L_1$, and the VF power supply 16 may generate a high frequency current having a reflection minimum frequency $F_2$ of the second route $L_2$ (hereinafter, simply referred to as "reflection minimum frequency $F_2$") in order to cause a large amount of high frequency current to flow through the second route $L_2$. Also, the amount of plasma generated in the vicinity of the route of the high frequency current depends on the amount of the high frequency current flowing through the route.

Accordingly, the present exemplary embodiment adjusts the amount of the high frequency current flowing through the first route $L_1$ or the second route $L_2$ by changing the frequency of the high frequency current generated from the VF power supply 16 so as to control the amount of the plasma generated in the vicinity of the first route $L_1$ or the second route $L_2$. For example, the VF power supply 16 may generate a high frequency current having a frequency close to the reflection minimum frequency $F_1$ so that a large amount of high frequency current may flow through the first route $L_1$ to increase the amount of plasma generated in the vicinity of the first route $L_1$, and may generate a high frequency current having a frequency close to the reflection minimum frequency $F_2$ so that a large amount of high frequency current may flow through the second route $L_2$ to increase the amount of plasma generated in the vicinity of the second route $L_2$.

Accordingly, in the plasma processing apparatus 10, the generated amount of the plasma may be locally controlled within the chamber 11. Here, there is no need to dispose a specific high frequency power supply for each of the first route $L_1$ and the second route $L_2$, and the amount of a high frequency current flowing through the first route $L_1$ or the second route $L_2$ may be adjusted by only one VF power supply 16. This improves the degree of freedom of control of plasma distribution within the chamber 11 to uniformly perform a plasma processing at a low cost, without complicating the configuration of the plasma processing apparatus 10.

The VF power supply 16 electronically changes a frequency of a high frequency current, and thus quickly changes the frequency. As a result, the control of distribution of plasma within the chamber 11 may be quickly performed. The VF power supply 16 does not change a frequency of a high frequency current which is generated by mechanically switching circuits therein. Thus, the VF power supply 16 is hardly failed and as a result, the reliability of the plasma processing apparatus 10 may be improved.

In the plasma processing apparatus 10 described above, it is preferable that the reflection minimum frequency $F_1$ and the reflection minimum frequency $F_2$ fall in a frequency range of a high frequency current which is changeable by the VF power supply 16. Specifically, it is preferable that a difference between the reflection minimum frequency $F_1$ and the reflection minimum frequency $F_2$ is less than 2 MHz. In this case, the VF power supply 16 may generate both a high frequency current having the reflection minimum frequency $F_1$ and a high frequency current having the reflection minimum frequency $F_2$, and thus allow a large amount of high frequency current to flow through any of the first route $L_1$ and the second route $L_2$. As a result an adjustment width of the amount of plasma generated in the vicinity of the first route $L_1$ and in the second route $L_2$ may be increased.

Figure 2:
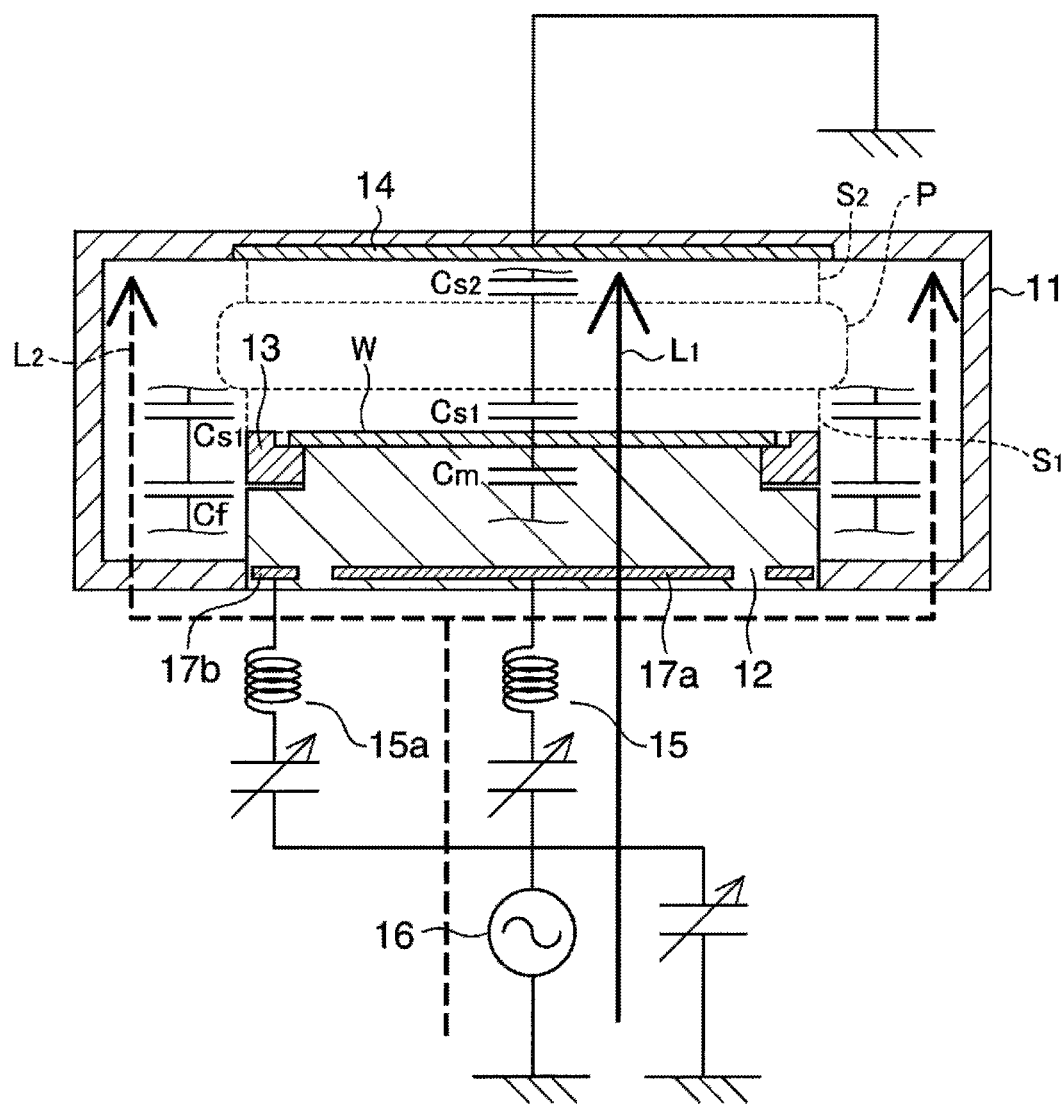
FIG. 2 is a cross-sectional view schematically illustrating a configuration of a first modified example of the plasma processing apparatus of FIG. 1.

In order to adjust the reflection minimum frequency $F_1$ or the reflection minimum frequency $F_2$, the path capacity of the first route $L_1$ or the second route $L_2$ may be changed, or as illustrated in FIG. 2, for example, an LC circuit 15a may be added to the second route $L_2$. In this case, the susceptor 12 may be made of a dielectric material, for example, ceramic, so that a high frequency current flowing through the LC circuit 15a does not join to the first route $L_1$ in the susceptor 12. In addition, conductive plates 17a and 17b may be embedded at a location corresponding to the wafer W and at a location corresponding to the focus ring 13, respectively, such that the LC circuit 15 may be connected to the conductive plate 17a, and the LC circuit 15a may be connected to the conductive plate 17b.

Figure 3:
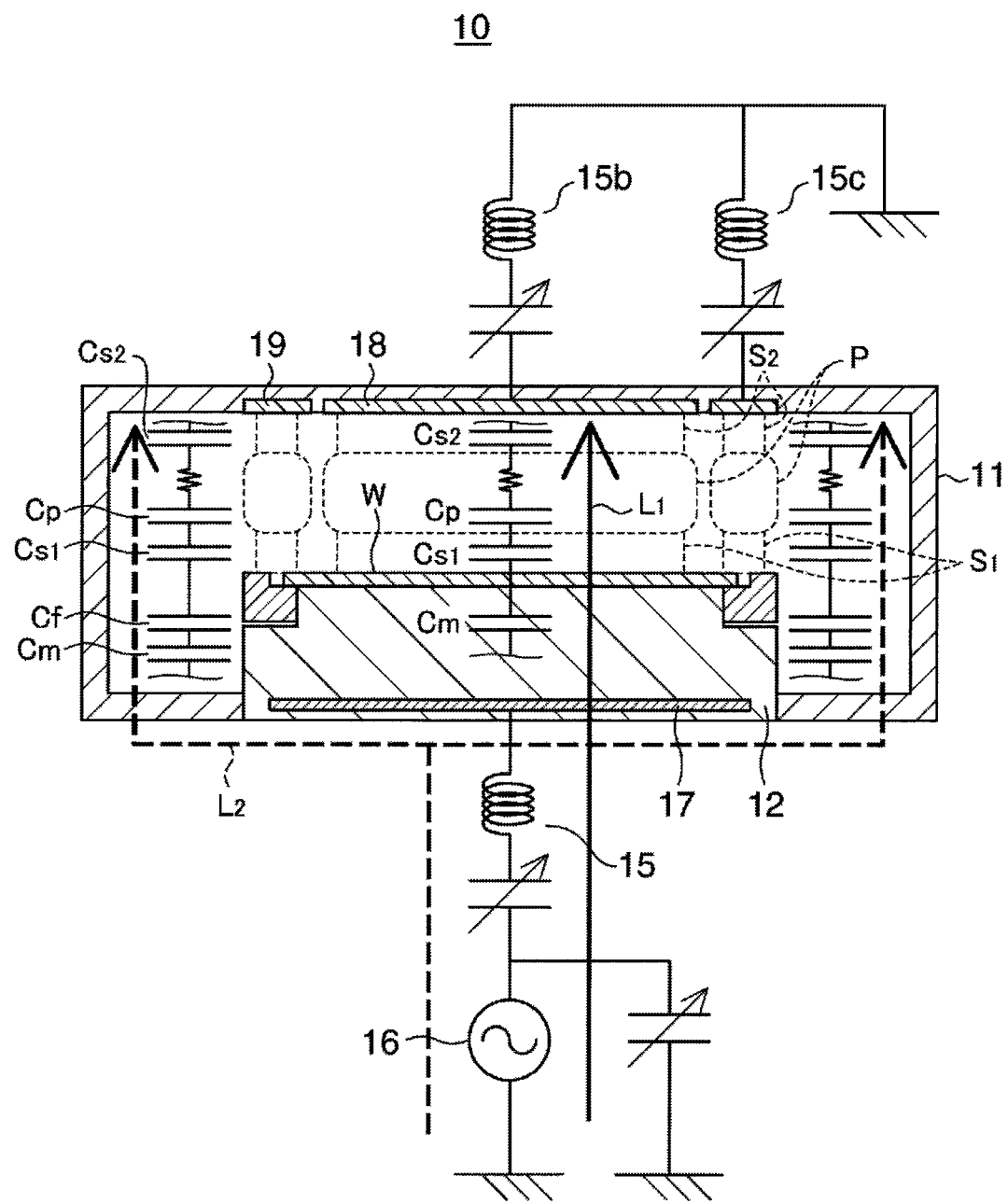
FIG. 3 is a cross-sectional view schematically illustrating a configuration of a second modified example of the plasma processing apparatus of FIG. 1.

For example, as illustrated in FIG. 3, the upper electrode 14 may be divided into an inner electrode 18 facing the wafer W, and an outer electrode 19 disposed to face the focus ring 13 and surround the inner electrode 18. The inner electrode 18 and the outer electrode 19 may be insulated from each other, the inner electrode 18 may be grounded via an LC circuit 15b, and the outer electrode 19 may be grounded via an LC circuit 15c. The susceptor 12 may be made of a dielectric material and a conductive plate 17 may be embedded in the susceptor 12 so that the LC circuit 15 may be connected to the conductive plate 17. In this case, the first route $L_1$ passes through the LC circuit 15, the conductive plate 17, the susceptor 12, the wafer W, the sheath $S_1$, the plasma P, the sheath $S_2$, the inner electrode 18, and the LC circuit 15b, starting from the VF power supply 16, and the second route $L_2$ passes through the LC circuit 15, the conductive plate 17, the susceptor 12, the focus ring 13, the sheath $S_1$, the plasma P, the sheath $S_2$, the outer electrode 19, and the LC circuit 15c, starting from the VF power supply 16. Here, for example, when the impedance of the LC circuit 15c may be set to be different from the impedance of the LC circuit 15b, the reflection minimum frequency $F_1$ or the reflection minimum frequency $F_2$ may be adjusted by simply changing a path capacity of the first route $L_1$ or the second route $L_2$.

A method of adjusting the reflection minimum frequency $F_1$ or the reflection minimum frequency $F_2$ is not limited to the method illustrated in FIG. 2 or 3. For example, the LC circuit 15 may be removed from the first route $L_1$, or may be added to the first route $L_1$ or the second route $L_2$. Also, the methods of FIGS. 2 and 3 may be combined with each other.

Hereinafter, a plasma processing method according to the present exemplary embodiment will be described.

Figure 4:
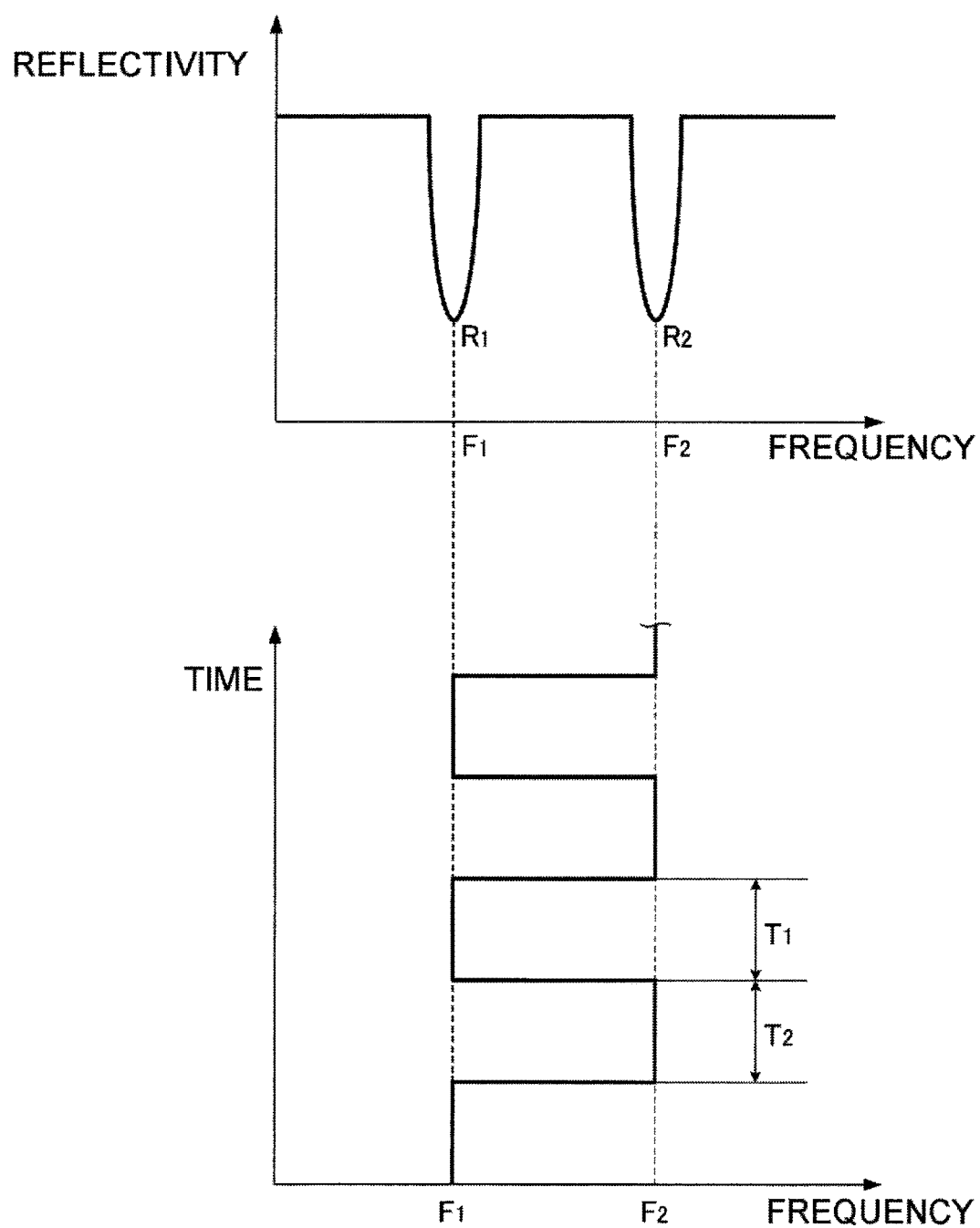
FIG. 4 illustrates graphs for explaining a plasma processing method according to the present exemplary embodiment.

FIG. 4 illustrates graphs for explaining a plasma processing method according to the present exemplary embodiment.

In FIG. 4, as illustrated in the upper graph, at the reflection minimum frequency $F_1$, the reflectivity of the first route $L_1$ becomes minimum, and at the reflection minimum frequency $F_2$, the reflectivity of the second route $L_2$ becomes minimum. However, in the present exemplary embodiment, as illustrated in a lower graph, the frequency of a high frequency current generated from the VF power supply 16 is alternately repeatedly changed between the reflection minimum frequency $F_1$ and the reflection minimum frequency $F_2$ in a pulse manner.

In FIG. 4, a reflectivity $R_1$ at the reflection minimum frequency $F_1$ and a reflectivity $R_2$ at the reflection minimum frequency $F_2$ are the same. Thus, when a period $T_1$ where a high frequency current having the reflection minimum frequency $F_1$ is generated (hereinafter, simply referred to as a "period $T_1$") and a period $T_2$ where a high frequency current having the reflection minimum frequency $F_2$ is generated (hereinafter, simply referred to as a "period $T_2$") are set to be the same, an accumulative amount of the plasma generated in the vicinity of the first route $L_1$, and an accumulative amount of the plasma generated in the vicinity of the second route $L_2$ may be the same. Thus, the amount of the plasma generated just above the wafer W and the amount of the plasma generated just above the focus ring 13 may be the same. As a result, the plasma P uniformly distributed within the chamber 11 may be obtained.

It may be desired to give a difference between the amount of the plasma generated just above the wafer W and the amount of the plasma generated just above the focus ring 13. In such a case, for example, when the period $T_1$ is set to be longer than the period $T_2$, the accumulative amount of the plasma generated in the vicinity of the first route $L_1$ may become larger than the accumulative amount of the plasma generated in the vicinity of the second route $L_2$, and as a result, the amount of the plasma generated just above the wafer W may become larger than the amount of the plasma generated just above the focus ring 13. Meanwhile, for example, when the period $T_2$ is set to be longer than the period $T_1$, the accumulative amount of the plasma generated in the vicinity of the second route $L_2$ may become larger than the accumulative amount of the plasma generated in the vicinity of the first route $L_1$, and as a result, the amount of the plasma generated just above the focus ring 13 may become larger than the amount of the plasma generated just above the wafer W.

When the first route $L_1$ and the second route $L_2$ have, for example, different LC circuits provided therein and thus the reflectivity at the reflection minimum frequency $F_1$ and the reflectivity at the reflection minimum frequency $F_2$ become different values, the period $T_1$ and the period $T_2$ may be differently set, and the ratio of the period $T_1$ and the period $T_2$ may be determined according to, for example, the ratio of the reflectivity $R_1$ of a high frequency current at the reflection minimum frequency $F_1$ and the reflectivity $R_2$ of a high frequency current at the reflection minimum frequency $F_2$. Specifically, in the case where the reflectivity $R_2$ is lower than the reflectivity $R_1$ (see the upper graph in FIG. 5), when the period $T_1$ is set to be longer than the period $T_2$ (see, the lower graph in FIG. 5), the accumulative amount of the plasma generated in the vicinity of the first route $L_1$ may become substantially equal to the accumulative amount of the plasma generated in the vicinity of the second route $L_2$, and as a result, the amount of the plasma generated just above the wafer W may become equal to the amount of the plasma generated just above the focus ring 13. Meanwhile, when the period $T_1$ and the period $T_2$ is set to be the same, the accumulative amount of the plasma generated in the vicinity of the first route $L_1$ may become smaller than the accumulative amount of the plasma generated in the vicinity of the second route $L_2$, and as a result, the amount of the plasma generated just above the wafer W may be set to be smaller than the amount of the plasma generated just above the focus ring 13.

Figure 6:
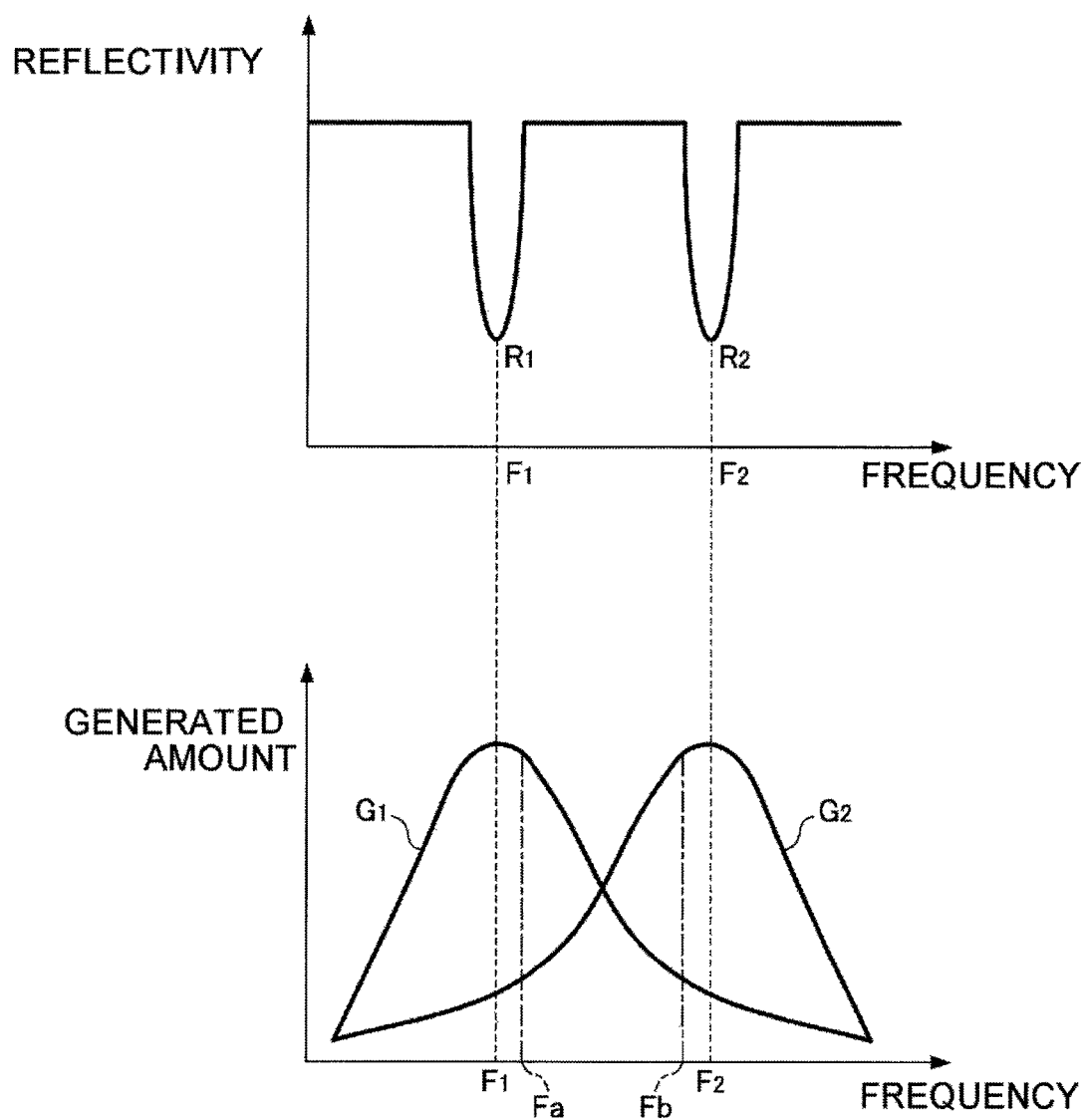
FIG. 6 illustrates graphs for explaining a second modified example of the plasma processing method of FIG. 4.

Meanwhile, as the frequency of a high frequency current is changed, the amount $G_1$ of plasma generated in the vicinity of the first route $L_1$ is gradually changed with the reflection minimum frequency $F_1$ as an apex and as the frequency of a high frequency current is changed, and the amount $G_2$ of plasma generated in the vicinity of the second route $L_2$ is gradually changed with the reflection minimum frequency $F_2$ as an apex (see the lower graph in FIG. 6). Accordingly, in a predetermined frequency range, the plasma may also be generated in the vicinity of the second route $L_2$ as well as being generated in the vicinity of the first route $L_1$.

Accordingly, the frequency of the high frequency current generated from the VF power supply 16 may be set to fall between the reflection minimum frequency $F_1$ and the reflection minimum frequency $F_2$. For example, when the frequency of the high frequency current is set as a frequency Fa closer to the reflection minimum frequency $F_1$ than to the reflection minimum frequency $F_2$, a large amount of plasma may be generated in the vicinity of the first route $L_1$ while the generation of the plasma may be maintained to some extent in the vicinity of the second route $L_2$. When the frequency of the high frequency current is set as a frequency Fb closer to the reflection minimum frequency $F_2$ than to the reflection minimum frequency $F_1$, a large amount of plasma may be generated in the vicinity of the second route $L_2$ while the generation of the plasma may be maintained to some extent in the vicinity of the first route $L_1$.

Figure 5:
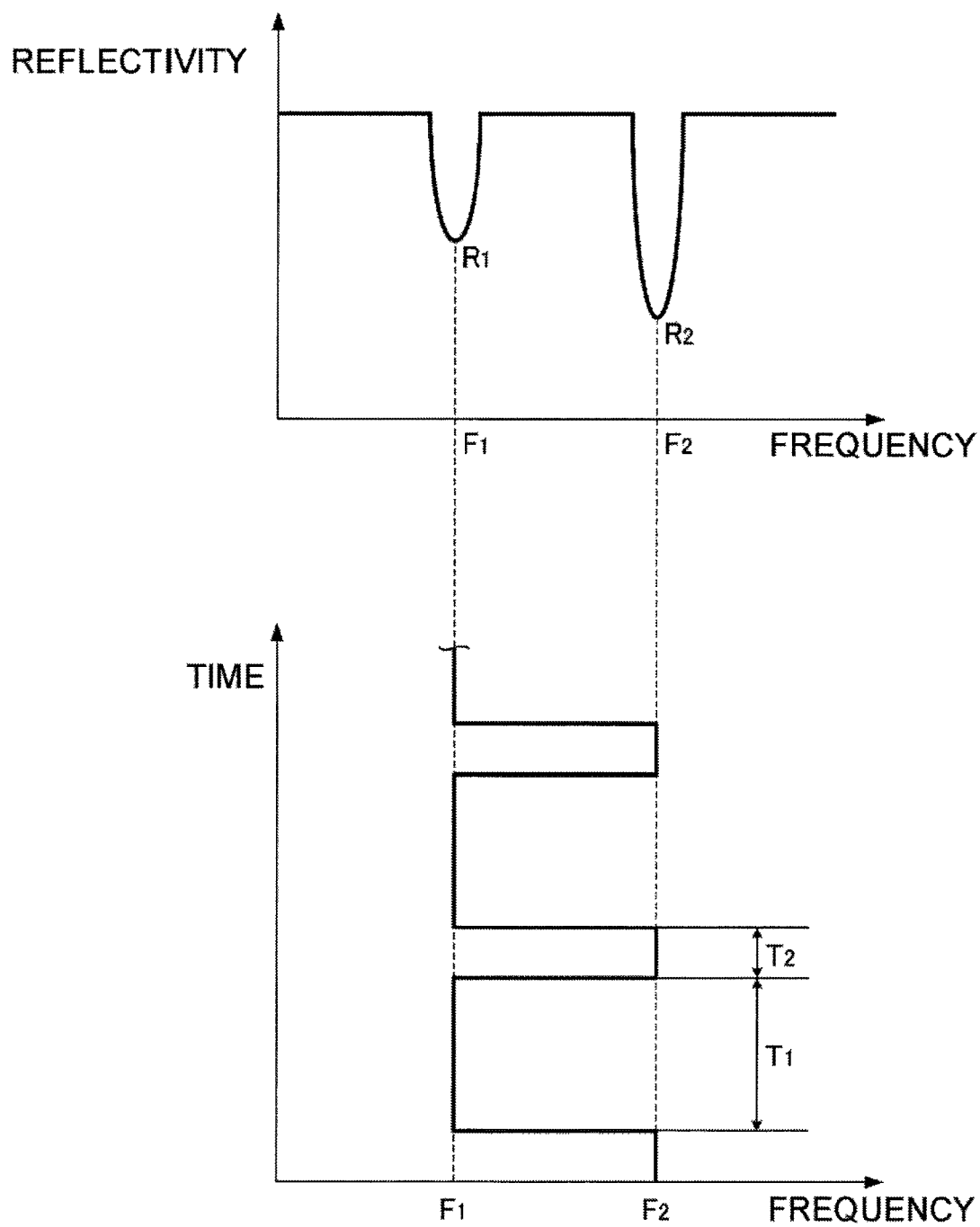
FIG. 5 illustrates graphs for explaining a first modified example of the plasma processing method of FIG. 4.

In the present exemplary embodiment, as illustrated in the upper graphs in FIGS. 4 to 6, even at the reflection minimum frequency $F_1$ or the reflection minimum frequency $F_2$, the reflectivity $R_1$ and the reflectivity $R_2$ do not become 0. Thus, it is preferable that the VF power supply 16 is highly reflection-resistant to allow the reflection of the high frequency current to some extent. Also, it is preferable that the VF power supply 16 generates a high frequency current in a larger amount than required in anticipation of the reflection of the high frequency current.

Hereinafter, a plasma processing apparatus according to a second exemplary embodiment of the present disclosure will be described.

The present exemplary embodiment is basically the same as the first exemplary embodiment described above in configurations and functional actions, but is different from the first exemplary embodiment described above in that a side wall electrode 20 is disposed on a side wall 11a of the chamber 11. Accordingly, descriptions on the redundant configurations and functional actions will be omitted, and configurations and functional actions specific to the present exemplary embodiment will be described.

Figure 7:
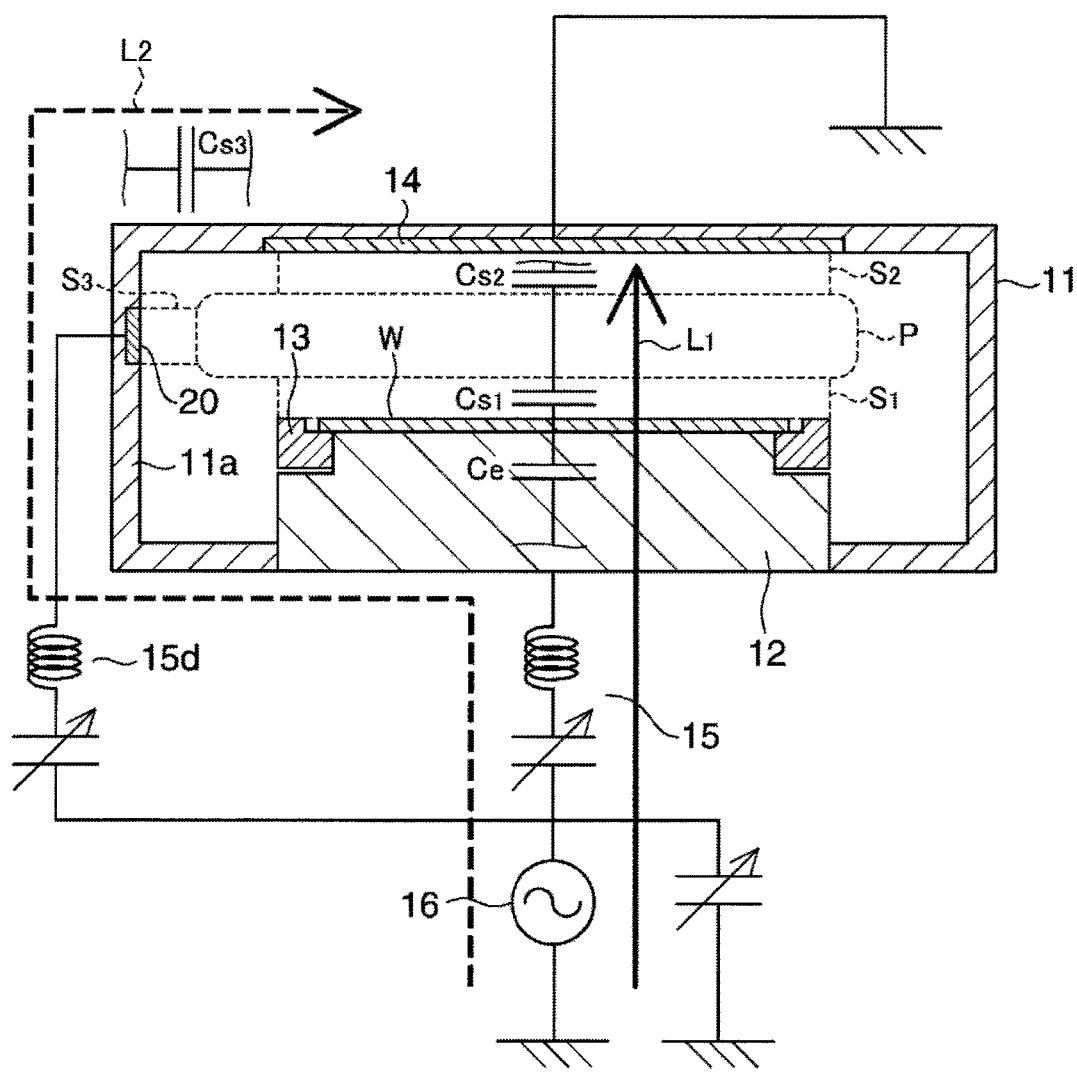
FIG. 7 is a cross-sectional view schematically illustrating a configuration of a plasma processing apparatus according to a second exemplary embodiment of the present disclosure.

FIG. 7 is a cross-sectional view schematically illustrating a configuration of a plasma processing apparatus according to the present exemplary embodiment.

In FIG. 7, the chamber 11 of a plasma processing apparatus 21 includes a side wall electrode 20 disposed on the side wall 11a to face plasma P, in which the side wall electrode 20 is connected to the VF power supply 16 via an LC circuit 15d.

In the plasma processing apparatus 21, when the VF power supply 16 applies a high frequency power to the side wall electrode 20, the plasma P extends to the vicinity of the side wall electrode 20. Thus, a sheath $S_3$ is interposed between the plasma P and the side wall electrode 20. Here, cations are implanted into the inner surface of the side wall 11a of the chamber 11 from the plasma P according to the potential of the side wall electrode 20, and the cations remove, for example, deposits deposited on the inner surface by sputtering. That is, the inner surface of the side wall 11a of the chamber 11 may be cleaned.

In the present exemplary embodiment, the second route $L_2$ passes through the LC circuit 15d, the side wall electrode 20, the sheath $S_3$, the plasma P, the sheath $S_2$, and the upper electrode 14, starting from the VF power supply 16. Here, for example, a path capacity $C_{s3}$ of the sheath $S_3$ is present in the second route $L_2$. Thus, the first route $L_1$ and the second route $L_2$ have different specific reflection minimum frequencies $F_1$ and $F_2$, respectively.

Accordingly, in the present exemplary embodiment, the amount of the high frequency current flowing through the first route $L_1$ or the second route $L_2$ may be adjusted by changing the frequency of the high frequency current generated from the VF power supply 16, so that the performance of generation of the plasma P and the performance of inner surface cleaning (hereinafter, simply referred to as "cleaning") of the side wall 11a of the chamber 11 may be switched to each other. For example, when the VF power supply 16 generates a high frequency current having a frequency close to the reflection minimum frequency $F_1$, the plasma P may be generated in the vicinity of the first route $L_1$. When the VF power supply 16 generates a high frequency current having a frequency close to the reflection minimum frequency $F_2$, the cleaning may be performed. That is, the performance of generation of the plasma P and the performance of the cleaning may be switched to each other only by changing the frequency of the high frequency current generated from the VF power supply 16. Thus, the cleaning may be easily performed at a desired point of time.

Hereinafter, a plasma processing apparatus according to a third exemplary embodiment of the present disclosure will be described.

The present exemplary embodiment is basically the same as the first exemplary embodiment described above in configurations and functional actions, but is different from the first exemplary embodiment described above in that the present exemplary embodiment includes a switching box 22 disposed between the upper electrode 14 and the ground. Accordingly, descriptions on the redundant configurations and functional actions will be omitted, and configurations and functional actions specific to the present exemplary embodiment will be described.

Figure 8:
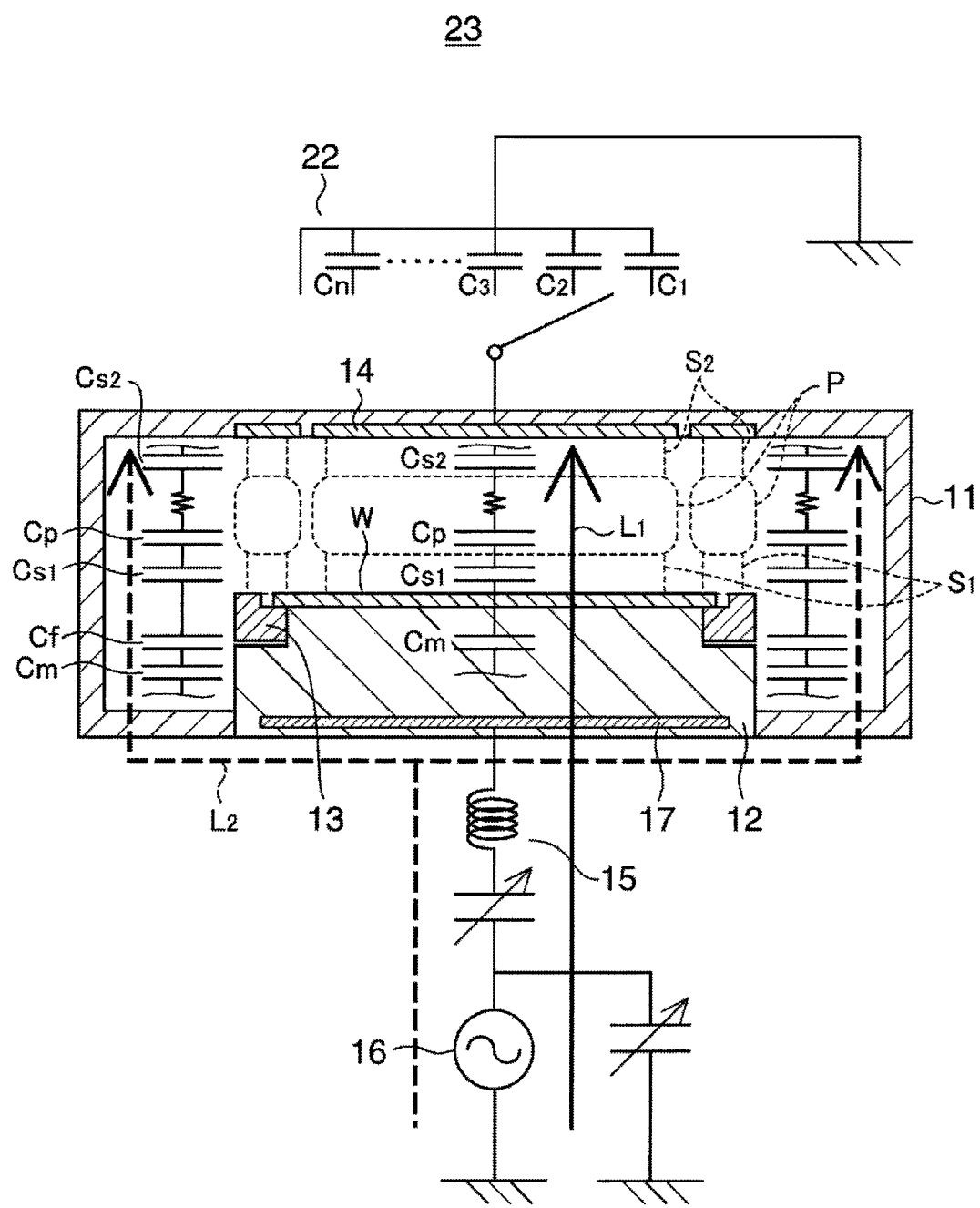
FIG. 8 is a cross-sectional view schematically illustrating a configuration of a plasma processing apparatus according to a third exemplary embodiment of the present disclosure.

FIG. 8 is a cross-sectional view schematically illustrating a configuration of a plasma processing apparatus according to the present exemplary embodiment.

In FIG. 8, a plasma processing apparatus 23 includes a switching box 22 disposed between the upper electrode 14 and the ground, outside the chamber 11. The susceptor 12 is made of a dielectric material and a conductive plate 17 is embedded in the susceptor 12 so that the LC circuit 15 is connected to the conductive plate 17.

The switching box 22 is a capacity-variable mechanism in which a plurality of capacitors having different capacities is included, and a capacitor having a desired capacity may be selected by mechanically switching an internal route to change a path capacity $C_v$ of the switching box 22.

In the present exemplary embodiment, the first route $L_1$ passes through the LC circuit 15, the conductive plate 17, the susceptor 12, the wafer W, the sheath $S_1$, the plasma P, the sheath $S_2$, the upper electrode 14, and the switching box 22, starting from the VF power supply 16, and the second route $L_2$ passes through the LC circuit 15, the conductive plate 17, the susceptor 12, the focus ring 13, the sheath $S_1$, plasma P, the sheath $S_2$, the upper electrode 14, and the switching box 22, starting from the VF power supply 16.

In the first route $L_1$, for example, a path capacity $C_m$ of the susceptor 12, a path capacity $C_{s1}$ of the sheath $S_1$, a path capacity $C_p$ of the plasma P, a path capacity $C_{s2}$ of the sheath $S_2$, and a path capacity $C_v$ of the switching box 22 exist, and in the second route $L_2$, for example, a path capacity $C_m$ of the susceptor 12, a path capacity $C_f$ of the focus ring 13, a path capacity $C_{s1}$ of the sheath $S_1$, a path capacity $C_p$ of the plasma P, a path capacity $C_{s2}$ of the sheath $S_2$, and a path capacity $C_v$ of the switching box 22 exist. Thus, the first route $L_1$ and the second route $L_2$ have different specific reflection minimum frequencies $F_1$ and $F_2$, respectively.

In the plasma processing apparatus 23, the path capacity $C_p$ of the plasma P is largely changed after the plasma P is ignited, and thus the reflection minimum frequency $F_1$ is also largely changed. Here, in a case where the VF power supply 16 has generated a high frequency current having a reflection minimum frequency $F_1$ based on a pre-ignition path capacity C of the plasma P before the ignition of the plasma P so as to allow a large amount of high frequency current to flow through the first route $L_1$, the reflection minimum frequency $F_1$ is largely changed after the ignition of the plasma P. Thus, it may be difficult to allow the large amount of high frequency current to flow through the first route $L_1$, and to maintain the ignited state of the plasma P.

Accordingly, in the present exemplary embodiment, the path capacity $C_v$ of the switching box 22 is changed according to a change in the path capacity C of the plasma P so that the reflection minimum frequency $F_1$ is not largely changed after the plasma P is ignited, preferably the reflection minimum frequency $F_1$ is not changed. Accordingly, even when the VF power supply 16 has generated a high frequency current having the reflection minimum frequency $F_1$ based on the pre-ignition path capacity C of the plasma P, it is possible to suppress the amount of the high frequency current flowing through the first route $L_1$ from being abruptly reduced after the plasma P is ignited, and to maintain the ignition state of the plasma P.

In a case where it is impossible to maintain the same reflection minimum frequency $F_1$ before and after ignition of the plasma P even by changing the path capacity $C_v$ of the switching box 22, the frequency of the high frequency current generated from the VF power supply 16 may be set to the reflection minimum frequency $F_1$ after the ignition of the plasma P or a value close to the reflection minimum frequency $F_1$.

Hereinafter, a plasma processing apparatus according to a fourth exemplary embodiment of the present disclosure will be described.

The present exemplary embodiment is basically the same as the first exemplary embodiment described above in configurations and functional actions, but is different from the above described first exemplary embodiment in that the present exemplary embodiment includes a circulator 24 disposed between the upper electrode 14 and the ground. Accordingly, descriptions on the redundant configurations and functional actions will be omitted, and configurations and functional actions specific to the present exemplary embodiment will be described.

Figure 9:
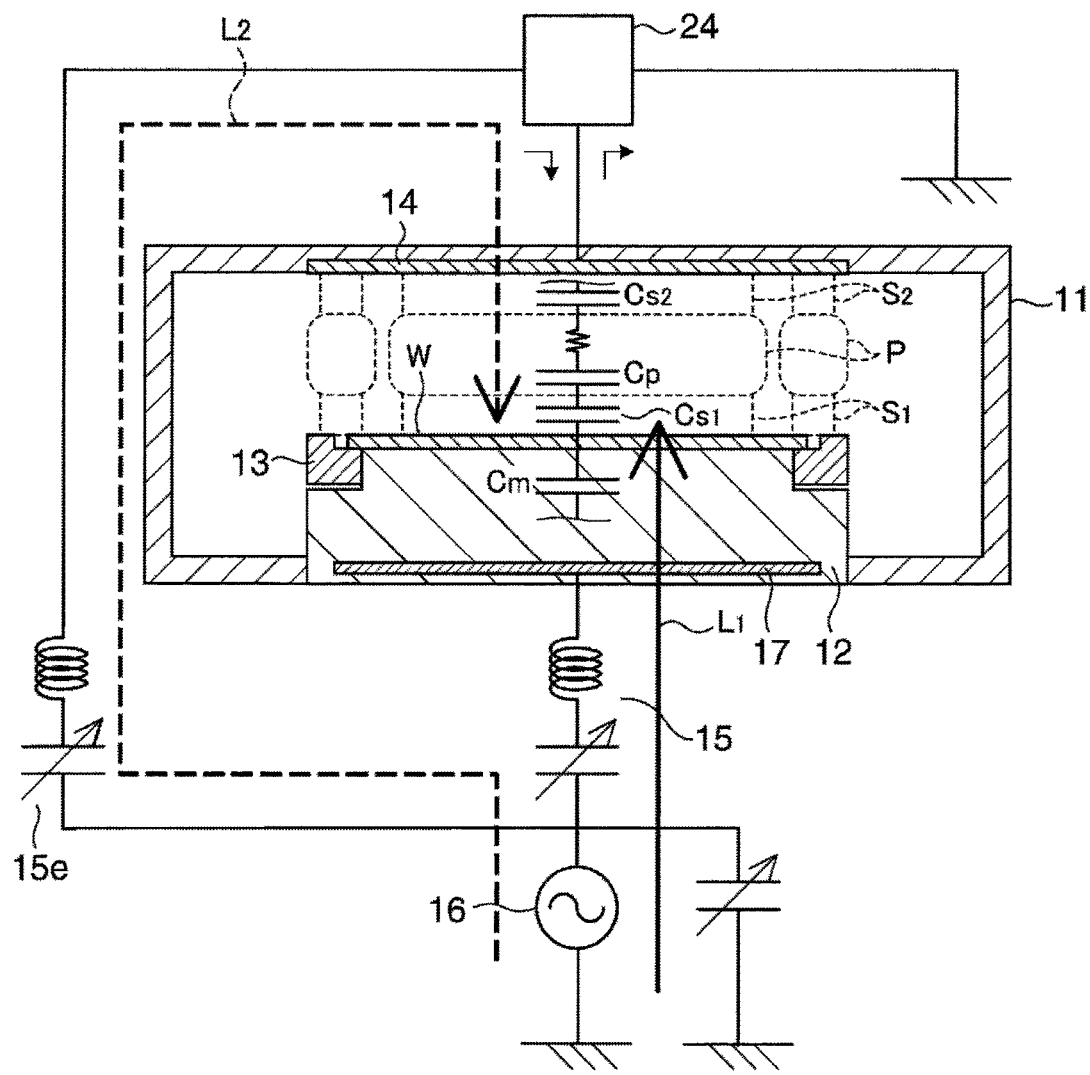
FIG. 9 is a cross-sectional view schematically illustrating a configuration of a plasma processing apparatus according to a fourth exemplary embodiment of the present disclosure.

FIG. 9 is a cross-sectional view schematically illustrating a configuration of a plasma processing apparatus according to the present exemplary embodiment.

In FIG. 9, a plasma processing apparatus 25 includes a circulator 24 disposed between the upper electrode 14 and the ground, outside the chamber 11. The susceptor 12 is made of a dielectric material and a conductive plate 17 is embedded in the susceptor 12 so that the LC circuit 15 is connected to the conductive plate 17.

In the present exemplary embodiment, starting from the VF power supply 16, the first route $L_1$ passes through the LC circuit 15, the conductive plate 17, the susceptor 12, the wafer W, the sheath $S_1$, the plasma P, the sheath $S_2$, the upper electrode 14, and the circulator 24. Starting from the VF power supply 16, the second route $L_2$ passes through an LC circuit 15e, the circulator 24, the upper electrode 14, the sheath $S_2$, the plasma P, the sheath $S_1$, the wafer W, the susceptor 12, the conductive plate 17, and the LC circuit 15.

In the first route $L_1$, for example, a path capacity of the LC circuit 15, a path capacity $C_m$ of the susceptor 12, a path capacity $C_{s1}$ of the sheath $S_1$, a path capacity $C_p$ of the plasma P, and a path capacity $C_{s2}$ of the sheath $S_2$ exist, and in the second route $L_2$, for example, a path capacity of the LC circuit 15e, a path capacity $C_{s2}$ of the sheath $S_2$, a path capacity $C_p$ of the plasma P, a path capacity $C_{s1}$ of the sheath $S_1$, a path capacity $C_m$ of the susceptor 12, and a path capacity of the LC circuit 15 exist. Thus, the first route $L_1$ and the second route $L_2$ have different specific reflection minimum frequencies $F_1$ and $F_2$, respectively.

However, as described above, since the first route $L_1$ advances from the susceptor 12 toward the upper electrode 14, the plasma P is generated in a large amount at the susceptor 12 side, for example, in the vicinity of the wafer W when a high frequency current flows through the first route $L_1$. Since the second route $L_2$ advances from the upper electrode 14 toward the susceptor 12, the plasma P is generated in a large amount in the vicinity of the upper electrode 14 when a high frequency current flows through the second route $L_2$.

Therefore, in the present exemplary embodiment, the amount of the high frequency current flowing through the first route $L_1$ or the second route $L_2$ may be adjusted by changing the frequency of the high frequency current generated from the VF power supply 16 so as to control the amount of the plasma generated in the vicinity of the wafer W or the upper electrode 14. For example, the VF power supply 16 may generate a high frequency current having a frequency close to the reflection minimum frequency $F_1$ so as to increase the amount of plasma generated in the vicinity of the wafer W, and may generate a high frequency current having a frequency close to the reflection minimum frequency $F_2$ so as to increase the amount of plasma generated in the vicinity of the upper electrode 14.

In the present exemplary embodiment, the circulator 24 is used to constitute the second route $L_2$. Instead of the circulator 24, however, a wall portion of the chamber 11 may be used to constitute the second route $L_2$. In this case, the second route $L_2$ passes through the LC circuit 15e, the upper electrode 14, the sheath $S_2$, the plasma P, and the wall portion of the chamber 11, starting from the VF power supply 16.

Hereinafter, a plasma processing apparatus according to a fifth exemplary embodiment of the present disclosure will be described.

The present exemplary embodiment is basically the same as the first exemplary embodiment described above in configurations and functional actions, but is different from the first exemplary embodiment described above in that the VF power supply 16 is connected to the upper electrode rather than the susceptor 12. Accordingly, descriptions on the redundant configurations and functional actions will be omitted, and configurations and functional actions specific to the present exemplary embodiment will be described.

Figure 10:
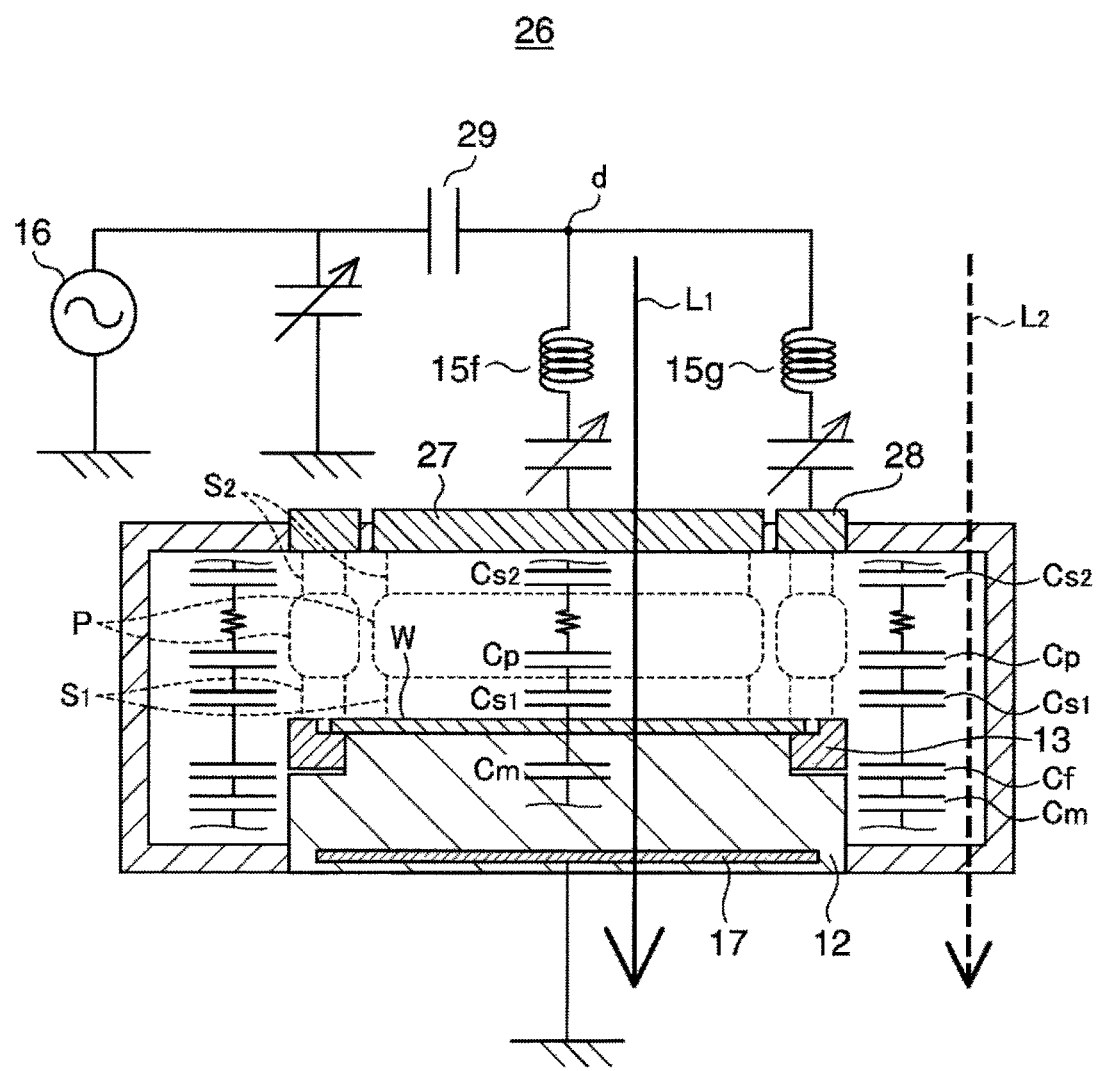
FIG. 10 is a cross-sectional view schematically illustrating a configuration of a plasma processing apparatus according to a fifth exemplary embodiment of the present disclosure.

FIG. 10 is a cross-sectional view schematically illustrating a configuration of a plasma processing apparatus according to the present exemplary embodiment.

In FIG. 10, in a plasma processing apparatus 26, the upper electrode 14 is divided into an inner electrode 27 facing the wafer W, and an outer electrode 28 disposed to face the focus ring 13 and to surround the inner electrode 27. The inner electrode 27 and the outer electrode 28 are insulated from each other. The susceptor 12 is made of a dielectric material, in which the conductive plate 17 is embedded in the susceptor 12. The susceptor 12 is grounded, the VF power supply 16 is connected to the inner electrode 27 via a capacitor 29 and an LC circuit 15f, and the VF power supply 16 is connected to the outer electrode 28 via the capacitor 29 and an LC circuit 15g.

In the present exemplary embodiment, the first route $L_1$ passes through the LC circuit 15f, the inner electrode 27, the sheath $S_2$, the plasma P, the sheath $S_1$, the wafer W, the susceptor 12, and the conductive plate 17 from a junction d at the downstream of the capacitor 29, and the second route $L_2$ passes through the LC circuit 15g, the outer electrode 28, the sheath $S_2$, the plasma P, the sheath $S_1$, the focus ring 13, the susceptor 12, and the conductive plate 17 from the junction d.

In the first route $L_1$, for example, a path capacity of the LC circuit 15f, a path capacity $C_{s2}$ of the sheath $S_2$, a path capacity $C_p$ of the plasma P, a path capacity $C_{s1}$ of the sheath $S_1$, and a path capacity $C_m$ of the susceptor 12 exist, and in the second route $L_2$, for example, a path capacity of the LC circuit 15g, a path capacity $C_{s2}$ of the sheath $S_2$, a path capacity $C_p$ of the plasma P, a path capacity $C_{s1}$ of the sheath $S_1$, a path capacity $C_f$ of the focus ring 13, and a path capacity $C_m$ of the susceptor 12 exist. Thus, the first route $L_1$ and the second route $L_2$ have different specific path capacities, respectively, and have different specific reflection minimum frequencies $F_1$ and $F_2$.

Accordingly, in the present exemplary embodiment, the amount of the high frequency current flowing through the first route $L_1$ or the second route $L_2$ may be adjusted by changing the frequency of the high frequency current generated from the VF power supply 16 so as to control the amount of the plasma generated in the vicinity of the first route $L_1$ or the second route $L_2$, in the same manner as in the first exemplary embodiment. Accordingly, in the plasma processing apparatus 26, the amount of the plasma generated within the chamber 11 may be locally controlled.

In the plasma processing apparatus 26 described above, it is preferable that the reflection minimum frequency $F_1$ and the reflection minimum frequency $F_2$ fall in a frequency range of a high frequency current which is changeable by the VF power supply 16. Thus, it may be required to adjust the reflection minimum frequency $F_1$ or the reflection minimum frequency $F_2$. In this case, in the same manner as in the first exemplary embodiment, for example, an LC circuit 15 may added to the first route $L_1$ or the second route $L_2$ to change a path capacity.

In the plasma processing apparatus 26 described above, in the same manner as in the first exemplary embodiment, the frequency of a high frequency current generated from the VF power supply 16 is alternately repeatedly changed between the reflection minimum frequency $F_1$ and the reflection minimum frequency $F_2$ in a pulse manner. In this case, the period $T_1$ and the period $T_2$ may be set to be the same or different according to, for example, an object of the plasma processing. Further, the ratio of the period $T_1$ and the period $T_2$ may be determined according to the ratio of the reflectivity $R_1$ of the high frequency current at the reflection minimum frequency $F_1$ and the reflectivity $R_2$ of the high frequency current at the reflection minimum frequency $F_2$. Also, the frequency of the high frequency current generated from the VF power supply 16 may be set to fall between the reflection minimum frequency $F_1$ and the reflection minimum frequency $F_2$.

In the above described plasma processing apparatus 26, the capacitor 29 is provided between the VF power supply 16, and the junction d of the first route $L_1$ and the second route $L_2$. Accordingly, in the route of the high frequency current from the VF power supply 16 to the ground, relative capacities of the first route $L_1$ and the second route $L_2$ may be reduced, and thus a difference between the first route $L_1$ and the second route $L_2$ may be reduced. As a result, the reflection minimum frequency $F_1$ and the reflection minimum frequency $F_2$ may be set to be close to each other, and the reflection minimum frequency $F_1$ and the reflection minimum frequency $F_2$ may securely fall in a frequency range of a high frequency current which is changeable by the VF power supply 16.

Hereinafter, a plasma processing apparatus according to a sixth exemplary embodiment of the present disclosure will be described.

The present exemplary embodiment is basically the same as the fifth exemplary embodiment described above in configurations and functional actions, but is different from the fifth exemplary embodiment described above in that supply of a high frequency power to the first route $L_1$ or the second route $L_2$ is performed by inductive coupling. Accordingly, descriptions on the redundant configurations and functional actions will be omitted, and configurations and functional actions specific to the present exemplary embodiment will be described.

Figure 11:
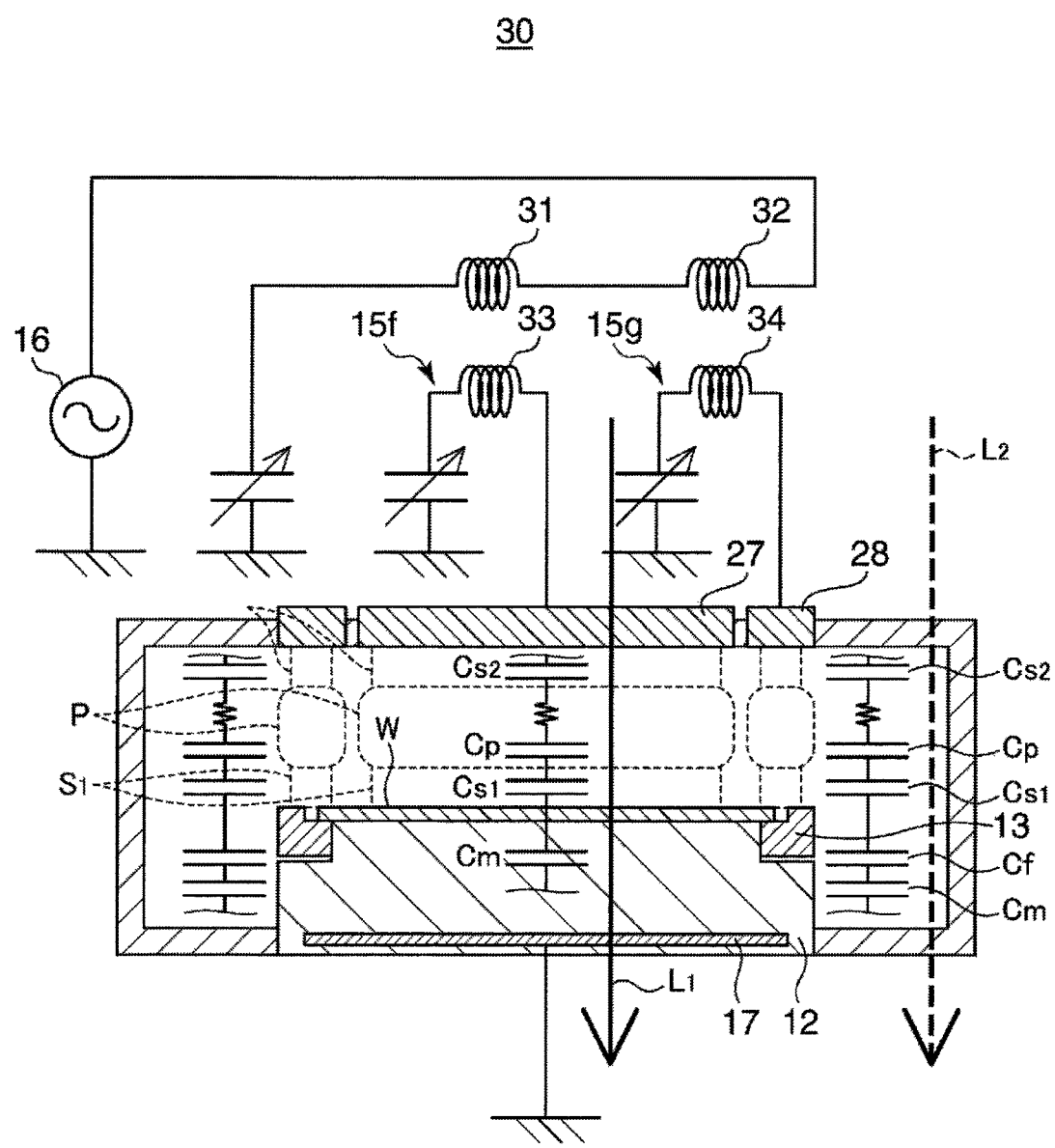
FIG. 11 is a cross-sectional view schematically illustrating a configuration of a plasma processing apparatus according to a sixth exemplary embodiment of the present disclosure.

FIG. 11 is a cross-sectional view schematically illustrating a configuration of a plasma processing apparatus according to the present exemplary embodiment.

In FIG. 11, in a plasma processing apparatus 30, the VF power supply 16 is grounded via a coil 31 and a coil 32, a coil 33 of the LC circuit 15f of the first route $L_1$ confronts the coil 31, and a coil 34 of the LC circuit 15g of the second route $L_2$ confronts the coil 32.

When a high frequency current having the reflection minimum frequency $F_1$ is generated from the VF power supply 16, the coil 31 is inductively coupled to the coil 33 in the first route $L_1$, so that the high frequency current as an induced current flows through the first route $L_1$. When a high frequency current having a reflection minimum frequency $F_2$ is generated from the VF power supply 16, the coil 32 is inductively coupled to the coil 34 in the second route $L_2$, so that the high frequency current as an induced current flows through the second route $L_2$.

Accordingly, in the present exemplary embodiment, when the frequency of the high frequency current generated from the VF power supply 16 may be changed and set to the reflection minimum frequency $F_1$ or the reflection minimum frequency $F_2$, the amount of plasma generated in the vicinity of the first route $L_1$ or the amount of plasma generated in the vicinity of the second route $L_2$ may be controlled by allowing the high frequency current to flow through the first route $L_1$ or the second route $L_2$. Accordingly, in the plasma processing apparatus 30, the amount of the plasma generated within the chamber 11 may be locally controlled.

However, in the inductive coupling, an induced current is not generated by a high frequency current having any frequency other than the reflection minimum frequency. Thus, in the present exemplary embodiment, when the frequency of the high frequency current generated from the VF power supply 16 is set to any frequency other than the reflection minimum frequency $F_1$ or the reflection minimum frequency $F_2$, plasma is not generated within the chamber 11. When the frequency of the high frequency current generated from the VF power supply 16 is set to the reflection minimum frequency $F_1$ or the reflection minimum frequency $F_2$, plasma is generated only in the vicinity of the first route $L_1$ or the second route $L_2$.

In the plasma processing apparatus 30 described above, wiring from the VF power supply 16 is not directly connected to the first route $L_1$ or the second route Thus, the VF power supply 16 is not subjected to reflection of the high frequency current from the first route $L_1$ or the second route $L_2$ so that the reliability of the VF power supply 16 may be improved.

In the plasma processing apparatus 30 described above, in order to adjust the reflection minimum frequency $F_1$ or the reflection minimum frequency $F_2$, for example, an LC circuit 15 may added to the first route $L_1$ or the second route $L_2$ to change a path capacity in the same manner as in the fifth exemplary embodiment. Also, in the plasma processing apparatus 30 described above, the frequency of a high frequency current generated from the VF power supply 16 is alternately repeatedly changed between the reflection minimum frequency $F_1$ and the reflection minimum frequency $F_2$ in a pulse manner. In this case, the period $T_1$ and the period $T_2$ may be set to be the same or different.

Figure 12A:
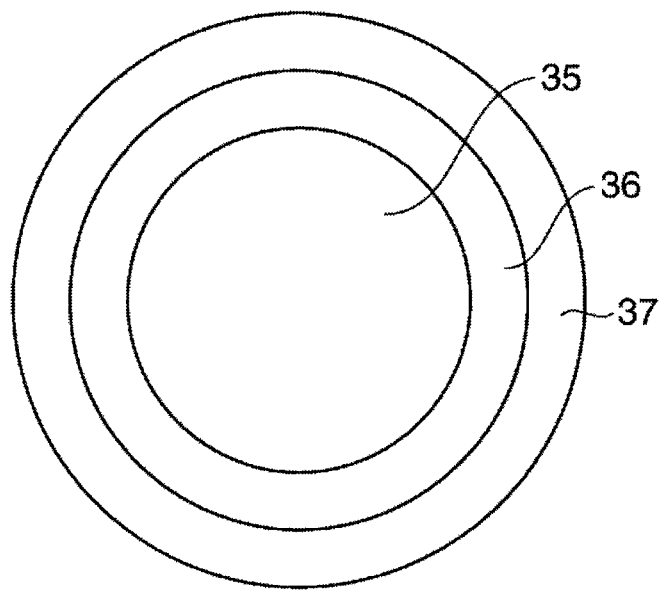
Figure 12B:
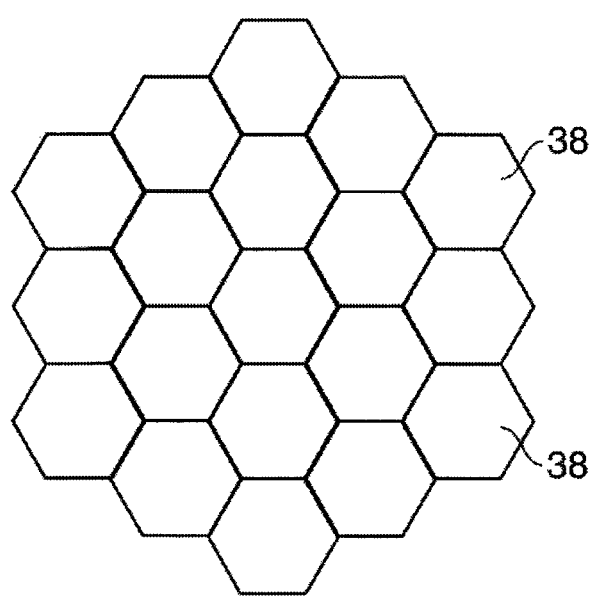

In the fifth or sixth exemplary embodiment described above, the upper electrode 14 is divided into the inner electrode 27 and the outer electrode 28, but the division form of the upper electrode 14 is not limited thereto. For example, as illustrated in FIG. 12A, the upper electrode 14 may be concentrically divided into three electrodes of an inner electrode 35, an intermediate electrode 36, and an outer electrode 37. Alternatively, as illustrated in FIG. 12B, the upper electrode 14 may be divided into, for example, a plurality of regular hexagonal honeycomb-shaped electrodes 38. In this case, wiring from the VF power supply 16 may be branched toward the respective electrodes, or a coil for inductive coupling may be provided in each electrode. However, in a case where the upper electrode is divided into a plurality of electrodes, wiring may become complicated due to the branch-off. Thus, it is preferable that the coil for inductive coupling is provided in each electrode in view of structure simplification.

Hereinafter, a plasma processing apparatus according to a seventh exemplary embodiment of the present disclosure will be described.

The present exemplary embodiment is basically the same as the fifth exemplary embodiment described above in configurations and functional actions, but is different from the fifth exemplary embodiment described above in that a side wall electrode 39 is disposed in a side wall 11b of the chamber 11. Accordingly, descriptions on the redundant configurations and functional actions will be omitted, and configurations and functional actions specific to the present exemplary embodiment will be described.

Figure 13:
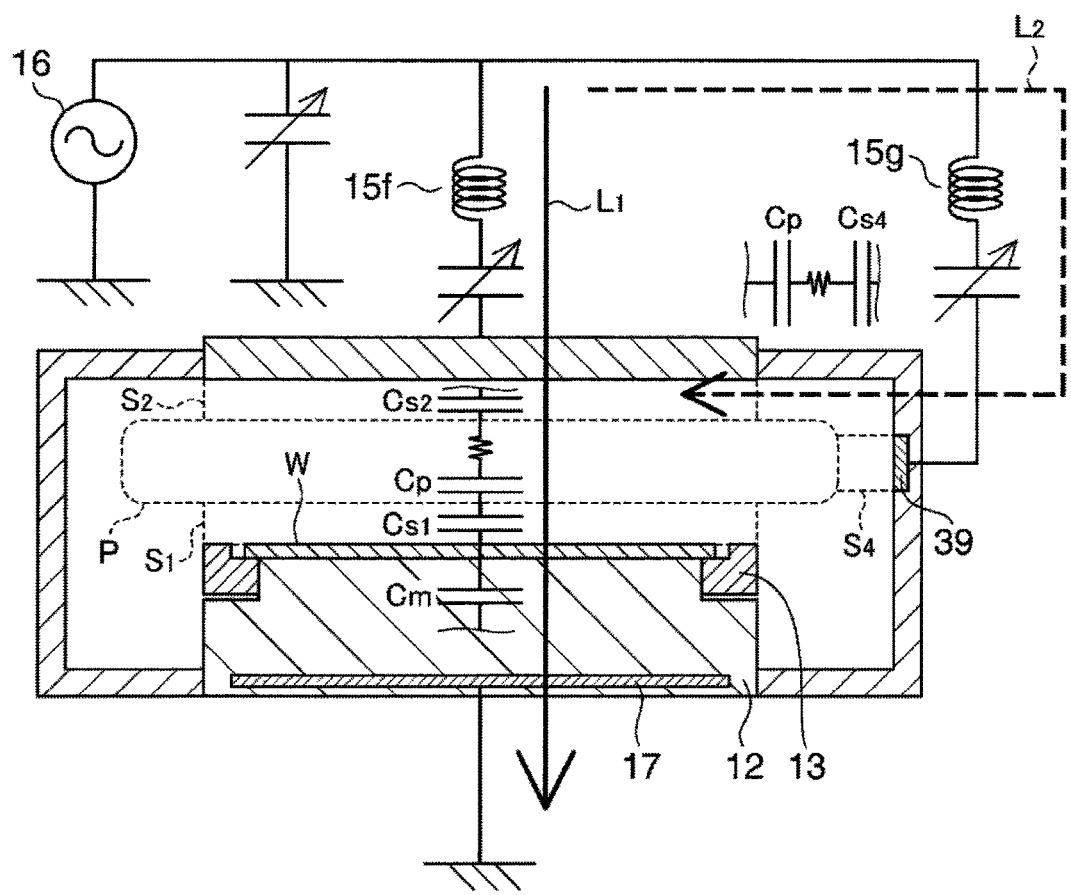
FIG. 13 is a cross-sectional view schematically illustrating a configuration of a plasma processing apparatus according to a seventh exemplary embodiment of the present disclosure.

FIG. 13 is a cross-sectional view schematically illustrating a configuration of a plasma processing apparatus according to the present exemplary embodiment.

In FIG. 13, the chamber 11 of a plasma processing apparatus 40 includes a side wall electrode 39 disposed on the side wall 11b so as to face plasma P, in which the side wall electrode 39 is connected to the VF power supply 16 via an LC circuit 15g.

In the plasma processing apparatus 40, when the VF power supply 16 applies a high frequency power to the side wall electrode 39, the plasma P extends to the vicinity of the side wall electrode 39 in the same manner as in the second exemplary embodiment. Thus, a sheath $S_4$ is interposed between the plasma P and the side wall electrode 39. Here, cations are implanted into the inner surface of the side wall 11b of the chamber 11 from the plasma P according to the potential of the side wall electrode 39, and the cations remove, for example, deposits deposited on the inner surface by sputtering. That is, the inner surface of the side wall 11b of the chamber 11 may be cleaned.

In the present exemplary embodiment, the second route $L_2$ passes through the LC circuit 15g, the side wall electrode 39, the sheath $S_4$, the plasma P, the sheath $S_1$, the susceptor 12 and the conductive plate 17, starting from the VF power supply 16. Here, in the second route $L_2$, for example, a path capacity $C_{s4}$ of the sheath $S_4$ is present. Thus, the first route $L_1$ and the second route $L_2$ have different specific reflection minimum frequencies $F_1$ and $F_2$, respectively.

That is, in the present exemplary embodiment, the amount of the high frequency current flowing through the first route $L_1$ or the second route $L_2$ may be adjusted only by changing the frequency of the high frequency current generated from the VF power supply 16 in the same manner as in the second exemplary embodiment, so that the performance of generation of the plasma P and the performance of inner surface cleaning of the side wall 11b of the chamber 11 are switched to each other. Thus, the cleaning may be easily performed at a desired point of time.

Hereinafter, a plasma processing apparatus according to an eighth exemplary embodiment of the present disclosure will be described.

The present exemplary embodiment is basically the same as the fifth exemplary embodiment described above in configurations and functional actions, but is different from the fifth exemplary embodiment described above in that a switching box 22 is provided to be disposed between the susceptor 12 (the conductive plate 17) and the ground. Accordingly, descriptions on the redundant configurations and functional actions will be omitted, and configurations and functional actions specific to the present exemplary embodiment will be described.

Figure 14:
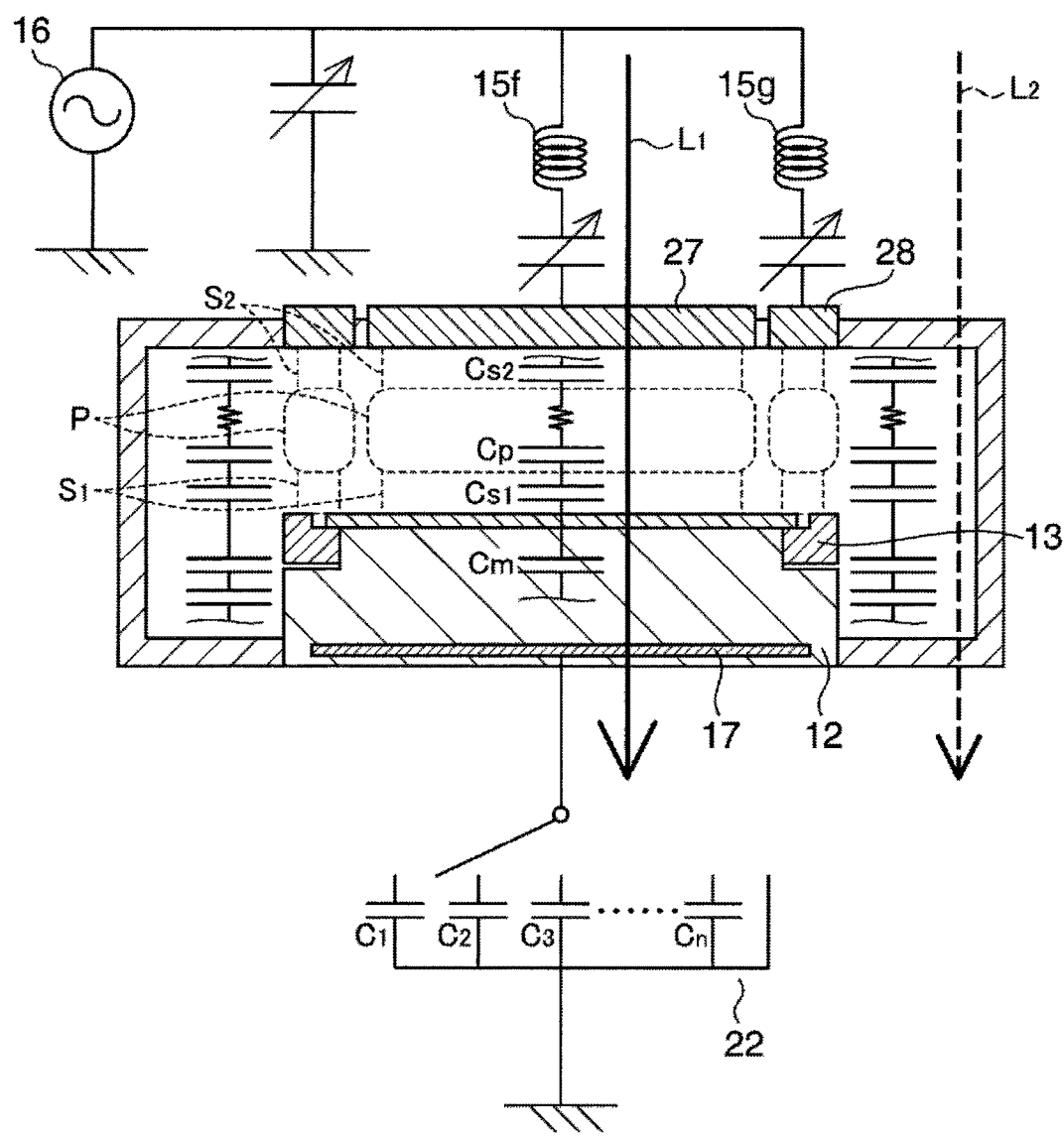
FIG. 14 is a cross-sectional view schematically illustrating a configuration of a plasma processing apparatus according to an eighth exemplary embodiment of the present disclosure.

FIG. 14 is a cross-sectional view schematically illustrating a configuration of a plasma processing apparatus according to the present exemplary embodiment.

In FIG. 14, a plasma processing apparatus 41 includes a switching box 22 disposed between the susceptor 12 and the ground, outside the chamber 11.

In the present exemplary embodiment, the first route $L_1$ passes through the LC circuit 15f, the inner electrode 27, the sheath $S_2$, the plasma P, the sheath $S_1$, the wafer W, the susceptor 12, the conductive plate 17, and the switching box 22, and the second route $L_2$ passes through the LC circuit 15g, the outer electrode 28, the sheath $S_2$, the plasma P, the sheath $S_1$, the focus ring 13, the susceptor 12, the conductive plate 17, and the switching box 22.

In the first route $L_1$, for example, a path capacity of the LC circuit 15f, a path capacity $C_{s2}$ of the sheath $S_2$, a path capacity $C_p$ of the plasma P, a path capacity $C_{s1}$ of the sheath $S_1$, a path capacity $C_m$ of the susceptor 12, and a path capacity $C_1, C_2, C_3 \ldots C_n$ of the switching box 22 exist, and in the second route $L_2$, for example, a path capacity of the LC circuit 15g, a path capacity $C_{s2}$ of the sheath $S_2$, a path capacity $C_p$ of the plasma P, a path capacity $C_{s1}$ of the sheath $S_1$, a path capacity $C_f$ of the focus ring 13, and a path capacity $C_m$ of the susceptor 12 exist. Thus, the first route $L_1$ and the second route $L_2$ have specific path capacities, respectively, and different specific reflection minimum frequencies $F_1$ and $F_2$, respectively.

In the plasma processing apparatus 41, in the same manner as in the plasma processing apparatus 23, the path capacity $C_p$ of the plasma P is largely changed after the plasma P is ignited, and thus the reflection minimum frequency $F_1$ is also largely changed.

Accordingly, in the present exemplary embodiment, in the same manner as in the third exemplary embodiment, the path capacity $C_n$, of the switching box 22 is changed according to a change in the path capacity C of the plasma P so that the reflection minimum frequency $F_1$ is not largely changed after the plasma P is ignited, preferably so that the reflection minimum frequency $F_1$ is not changed. Accordingly, even when the VF power supply 16 has generated a high frequency current having the reflection minimum frequency $F_1$ based on a pre-ignition path capacity C of the plasma P, the ignition state of the plasma P may be maintained.

In the foregoing, the present disclosure has been described using respective exemplary embodiments, but is not limited thereto.

For example, in the respective exemplary embodiments as described above, only two routes (the first route $L_1$ and the second route $L_2$) of a high frequency current are present. However, even when other routes having different capacities exist between the VF power supply 16 and the ground, these may become routes for the high frequency current. Thus, the number of routes of a high frequency current is not limited to two in a plasma processing apparatus. Here, the VF power supply 16 may generate a high frequency current having a reflection minimum frequency for each route, thereby more locally controlling the generated amount of plasma.

The object of the present disclosure may be achieved when a storage medium storing program codes of software is provided to, for example, a computer (not illustrated), and a CPU of the computer reads out and executes the program codes stored in the storage medium. The software is designed to execute the functions of the respective exemplary embodiments described above.

In this case, the program codes themselves, read out from the storage medium, may execute the functions of the respective exemplary embodiments as described above, and the program codes and the storage medium storing the program codes constitute the present disclosure.

The storage medium for providing the program codes may be anything as long as it can store the program codes, and examples thereof may include, an RAM, an NV-RAM, a floppy disk (registered mark), a hard disk, a magneto-optical disk, an optical disk such as, for example, a CD-ROM, a CD-R, a CD-RW, or a DVD (DVD-ROM, DVD-RAM, DVD-RW, DVD+RW), a magnetic tape, a volatile memory card, and other ROMs. Alternatively, the program codes may be provided to the computer by being downloaded from, for example, another computer or database (not illustrated) connected to, for example, internet, a commercial network, or a local area network.

As described above, the functions of the exemplary embodiments may be achieved by executing the program codes read out by the computer. Further, based on the instruction of the program codes, for example, an operating system (OS) driven in the CPU may perform some or all of actual processings, and then the above described functions of the exemplary embodiments may be achieved by the processings.

The program codes read out from the storage medium may be stored in a memory provided in a function expansion board inserted in the computer or a function expansion unit connected to the computer, and based on the instruction of the program codes, for example, a CPU provided in the function expansion board or the function expansion unit may perform some or all of actual processings. Then, the above described functions of the exemplary embodiments may be achieved by the processings.

The program codes may be constituted by object codes, program codes executable by an interpreter, or script data to be supplied to an OS.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a processing chamber configured to accommodate a substrate therein to perform a processing on the substrate by plasma;
an electrode and a counter electrode which faces the electrode configured to generate the plasma within the processing chamber;
a frequency-variable power supply connected to the electrode and configured to change a frequency of a high frequency power to be supplied to the electrode; and
a processor configured to execute a program stored in a non-transitory storage medium to perform a plasma processing,
wherein a plurality of routes of the high frequency current, which starts from the frequency-variable power supply and passes through the plasma to reach the counter electrode, is present, and the plurality of routes of the high frequency current includes at least a first route and a second route,
wherein a reflection minimum frequency of the first route is different from a reflection minimum frequency of the second route, and
wherein the processor is configured to execute the program such that the frequency-variable power supply changes the frequency of the high frequency power to be supplied to the electrode between the reflection minimum frequency of the first route and the reflection minimum frequency of the second route in order to adjust a ratio of an amount of the high frequency current flowing through the first route to an amount of the high frequency current flowing through the second route.

2. The plasma processing apparatus of claim 1, wherein the frequency-variable power supply is configured to change the frequency of the high frequency power to be supplied to the electrode such that a difference between the reflection minimum frequency of the first route and the reflection minimum frequency of the second route becomes less than 2 MHz.

3. The plasma processing apparatus of claim 1, further comprising a mounting stage disposed within the processing chamber and configured to mount the substrate thereon and to serve as the electrode, and a focus ring disposed to surround the mounted substrate,
wherein the frequency-variable power supply is connected to the mounting stage,
the first route passes through the mounting stage, the mounted substrate, and the plasma, and
the second route passes through the mounting stage, the focus ring and the plasma.

4. The plasma processing apparatus of claim 3, wherein the counter electrode includes an inner electrode which faces the substrate, and an outer electrode disposed to face the focus ring and to surround the inner electrode,
the first route also passes through the inner electrode, and
the second route also passes through the outer electrode.

5. The plasma processing apparatus of claim 1, further comprising a mounting stage disposed within the processing chamber and configured to mount the substrate thereon and to serve as the electrode,
wherein the processing chamber includes a side wall electrode which faces the plasma in a side wall of the processing chamber,
the frequency-variable power supply is connected to the mounting stage and the side wall electrode,
the first route passes through the mounting stage, the mounted substrate, and the plasma, and
the second route passes through the side wall electrode and the plasma.

6. The plasma processing apparatus of claim 1, further comprising a mounting stage disposed within the processing chamber and configured to mount the substrate thereon and to serve as the electrode, and a capacity-variable switching box disposed outside the processing chamber to change a capacity,
wherein the frequency-variable power supply is connected to the mounting stage,
the first route passes through the mounting stage, the mounted substrate, the plasma and the capacity-variable switching box, and
the capacity of the capacity-variable switching box is changed according to a change of a capacity of the plasma after the plasma is ignited.

7. The plasma processing apparatus of claim 1, further comprising a mounting stage disposed within the processing chamber and configured to mount the substrate thereon and to serve as the electrode, and a circulator disposed between the counter electrode and a ground,
    wherein the frequency-variable power supply is connected to the mounting stage,
    the first route passes through the mounting stage, the mounted substrate and the plasma, and
    the second route passes through the circulator, the counter electrode and the plasma.

8. The plasma processing apparatus of claim 1, further comprising a mounting stage disposed within the processing chamber and configured to mount the substrate thereon and to serve as the counter electrode,
    wherein the electrode is divided into at least a first electrode and a second electrode,
    the frequency-variable power supply is connected to the first electrode and the second electrode,
    the first route passes through the first electrode and the plasma, and
    the second route passes through the second electrode and the plasma.

9. The plasma processing apparatus of claim 8, wherein a capacitor is interposed between the frequency-variable power supply and a junction of the first route and the second route.

10. The plasma processing apparatus of claim 8, wherein in the first route, the frequency-variable power supply is capacitively coupled with the first electrode, and
    in the second route, the frequency-variable power supply is capacitively coupled with the second electrode.

11. The plasma processing apparatus of claim 8, wherein the first electrode is an inner electrode, and the second electrode is an outer electrode disposed to surround the inner electrode.

12. The plasma processing apparatus of claim 8, further comprising:
    an first impedance adjusting circuit interposed between the frequency-variable power supply and the first electrode; and
    an second impedance adjusting circuit interposed between the frequency-variable power supply and the second electrode.

13. The plasma processing apparatus of claim 1, further comprising a mounting stage disposed within the processing chamber and configured to mount the substrate thereon and to serve as the counter electrode,
    wherein the processing chamber includes a side wall electrode which faces the plasma in a side wall of the processing chamber,
    the frequency-variable power supply is connected to the electrode and the side wall electrode,
    the first route passes through the electrode and the plasma, and
    the second route passes through the side wall electrode and the plasma.

14. The plasma processing apparatus of claim 1, further comprising a mounting stage disposed within the processing chamber and configured to mount the substrate thereon and to serve as the counter electrode and a capacity-variable switching box disposed outside the processing chamber to change a capacity,
    wherein the frequency-variable power supply is connected to the electrode,
    the first route passes through the electrode, the plasma, the mounted substrate, the mounting stage, and the capacity-variable switching box, and
    the capacity of the capacity-variable switching box is changed according to a change of an impedance of the first route after the plasma is ignited.

15. The plasma processing apparatus of claim 1, wherein at least one of the first route and the second route includes an impedance adjusting circuit.

16. The plasma processing apparatus of claim 15, wherein the impedance adjusting circuit is interposed between the frequency-variable power supply and the electrode.

17. The plasma processing apparatus of claim 1, wherein the plasma processing apparatus is a parallel plate capacitive-coupled plasma processing apparatus.

18. A method for performing a processing by plasma in a plasma processing apparatus including a processing chamber, an electrode, a counter electrode which faces the electrode, and a frequency-variable power supply connected to the electrode, the method comprising:
    supplying a high frequency power from the frequency-variable power supply to the electrode to generate the plasma such that a plurality of routes of the high frequency current, which starts from the frequency-variable power supply and passes through the plasma to reach the counter electrode, is present, the plurality of routes of the high frequency current including at least a first route and a second route, and a reflection minimum frequency of the first route being different from a reflection minimum frequency of the second route, and
    changing a frequency of the high frequency power of the frequency-variable power supply between the reflection minimum frequency of the first route and the reflection minimum frequency of the second route in order to adjust a ratio of an amount of the high frequency current flowing through the first route to an amount of the high frequency current flowing through the second route.

19. The method of claim 18, wherein a difference between the reflection minimum frequency of the first route and the reflection minimum frequency of the second route is less than 2 MHz.

20. The method of claim 18, wherein the frequency-variable power supply alternately repeats generation of the high frequency current having the reflection minimum frequency of the first route, and generation of the high frequency current having the reflection minimum frequency of the second route.

21. The method of claim 18, wherein a ratio of a period where the high frequency current having the reflection minimum frequency of the first route is generated and a period where the high frequency current having the reflection minimum frequency of the second route is determined based on a ratio of a reflectivity of the high frequency current at the reflection minimum frequency of the first route and a reflectivity of the high frequency current at the reflection minimum frequency of the second route.

22. The method of claim 18, wherein the frequency-variable power supply supplies the high frequency power having a frequency between the reflection minimum frequency of the first route and the reflection minimum frequency of the second route.

\* \* \* \* \*